US012567542B2

(12) United States Patent
Gu et al.

(10) Patent No.: US 12,567,542 B2
(45) Date of Patent: Mar. 3, 2026

(54) ENGINEERED DIELECTRIC META-MATERIALS

(71) Applicants: Drexel University, Philadelphia, PA (US); epoXtal, LLC, Philadelphia, PA (US); The Regents of the University of California, Oakland, CA (US)

(72) Inventors: Zongquan Gu, Chalfont, PA (US); Jonathan E. Spanier, Bala Cynwyd, PA (US); Lane W. Martin, Moraga, CA (US); Christopher R. Elsass, Santa Barbara, CA (US); Alessia Polemi, Philadelphia, PA (US); Anoop Rama Damodaran, Minneapolis, MN (US)

(73) Assignees: Drexel University, Philadelphia, PA (US); epoXtal, LLC, Philadelphia, PA (US); The Regents of the University of California, Oakland, CA (US)

( * ) Notice: Subject to any disclaimer, the term of this patent is extended or adjusted under 35 U.S.C. 154(b) by 1324 days.

(21) Appl. No.: 17/264,687

(22) PCT Filed: Aug. 1, 2019

(86) PCT No.: PCT/US2019/044736
§ 371 (c)(1),
(2) Date: Jan. 29, 2021

(87) PCT Pub. No.: WO2020/028711
PCT Pub. Date: Feb. 6, 2020

(65) Prior Publication Data
US 2021/0343479 A1 Nov. 4, 2021

Related U.S. Application Data

(60) Provisional application No. 62/713,226, filed on Aug. 1, 2018.

(51) Int. Cl.
| | | |
|---|---|---|
| *H01G 7/02* | (2006.01) | |
| *H01G 5/013* | (2006.01) | |
| *H10N 30/853* | (2023.01) | |

(52) U.S. Cl.
CPC ........... *H01G 7/026* (2013.01); *H01G 5/0138* (2013.01); *H10N 30/8536* (2023.02); *H10N 30/8554* (2023.02)

(58) Field of Classification Search
CPC .. H01G 7/026; H01G 5/0138; H10N 30/8536; H10N 30/8554

(Continued)

(56) References Cited

FOREIGN PATENT DOCUMENTS

| CN | 108281544 A | 7/2018 |
|---|---|---|
| JP | 2006-152089 A | 6/2006 |

(Continued)

OTHER PUBLICATIONS

Ferroelectric and optical properties of Ba0,8Sr0_2 TiO3 thin film; F. M. Pontes, E. R. Leite,) D. S. L Pontes, and E. Longo; Joijrnal of Applied Physics vol. 91. NI'MBER 9; May 1, 2002 From the IDS (Year: 2002).*

(Continued)

*Primary Examiner* — Humera N. Sheikh
(74) *Attorney, Agent, or Firm* — Smith, Gambrell & Russell LLP

(57) ABSTRACT

The present disclosure describes a strained dielectric material comprising at least one type of component containing a domain wall variant pattern, or superdomain structure, that is in phase-co-existence with, or in close phase proximity to, a paraelectric state achieved at zero electric field or over a finite range of non-zero electric field, wherein the at least one type of component comprises one or more of an in-plane (Continued)

sub-domain polarization component, a plane-normal sub-domain polarization component, or a solid solution of a ferroelectric.

20 Claims, 25 Drawing Sheets

(58) Field of Classification Search
USPC ......................................................... 428/701
See application file for complete search history.

(56) References Cited

FOREIGN PATENT DOCUMENTS

| | | |
|---|---|---|
| WO | 2012/114930 A1 | 8/2012 |
| WO | 2020/028711 A1 | 2/2020 |

OTHER PUBLICATIONS

Voltage tunable epitaxial PbxSr(1-x )TiO3 films on sapphire by MOCVD: Nanostructure and microwave properties; S.K. Dey*, C.G. Wang, W. Cao, S. Bhaskar, J. Li; Journal of Materials Science 41 (2006) 77-86 (Year: 2006).*

Resonant domain-wall-enhanced tunable microwave ferroelectrics; Zongquan Gu et al; Nature | vol. 560 (P622-628) ; doi: 10.1038/s41586-018-0434-2. Epub Aug. 20, 2018. PMID: 30127406 (Year: 2018).*

Pontes, et al.; Ferroelectric and Optical Properties of Ba0.8Sr0.2TiO3 Thin Film; Journal of Applied Physics; vol. 91, No. 9; May 1, 2002; p. 5972-5978.

Soukiassian, et al.; "Growth of Nanoscale BaTiO3/SrTiO3 Superlattices by Molecular-Beam Epitaxy"; Journal of Materials Research; vol. 23, No. 5 May 1, 2008; p. 1417-1432.

Daumont, et al.; "Fast Track Communication; Strain Dependence of Polarization and Piezoelectric Response in Epitaxial BiFeO3 Thin Films"; Journal of Physics: Condensed Matter; vol. 24, No. 16; Mar. 30, 2021; p. 1-5.

Damodaran, et al.; "New Modalities of Strain-Control of Ferroelectric Thin Films"; Journal of Physics: Condensed Matter; vol. 28, No. 26; May 17, 2016; p. 1-36.

Lacotte, et al.; "Preferential Orientation Relationships in Ca2MnO4 Ruddlesden-Popper Thin Films"; Journal of Applied Physics; vol. 118; May 6, 2015; p. 1-20.

International Search Report and Written Opinion dated Nov. 15, 2019 for International Application No. PCT/US2019/044736, filed Aug. 1, 2019; 25 pages.

* cited by examiner

SP199
BST/MgO

Ba/Sr
Average: 3.622
Interface: 3.737
Middle: 3.581
Surface: 3.474

Ba/Ti
Average: 0.787
Interface: 0.800
Middle: 0.788
Surface: 0.764

Sr/Ti
Average: 0.217
Interface: 0.214
Middle: 0.22
Surface: 0.220

Thickness
Total: 95 nm
Interface: 43.03 nm
Middle: 25.35 nm
Surface: 26.62 nm $Ba_{0.784}Sr_{0.216}TiO_3$

ENGINEERED DIELECTRIC META-MATERIALS

CROSS-REFERENCE TO RELATED APPLICATIONS

This application is a National Stage Application of International Application No. PCT/US2019/044736, filed Aug. 1, 2019, which claims the benefit of U.S. Provisional Application No. 62/713,226, filed Aug. 1, 2018, which are hereby incorporated herein in their entirety.

GOVERNMENT RIGHTS

This invention was made in part with government support under Grant No. NSF IIP 1549668 awarded by the National Science Foundation (NSF) and under Grant No. DMR 1124696 provided by the NSF. The government has certain rights in the invention.

TECHNICAL FIELD

The technical field generally relates to dielectric, piezoelectric, ferroelectric materials. More specifically, the technical field relates to engineered meta-materials and complex collections of domain wall variants, constituting superdomain structures of such materials.

BACKGROUND

Complex ferroelectric domain structures have been predicted and realized in perovskite $ABO_3$ thin films such as $PbTiO_3$, $Pb(Zr,Ti)O_3$ and $BiFeO_3$. The domain patterns can be engineered by the strain tuning, the orientation of the substrate termination, uniform film composition or graded, the film thickness, and/or the electrical boundary condition. Such domain patterns may be configured to achieve significant improvements in the dielectric, pyroelectric, and piezoelectric properties. Films comprised of simple c domains (e.g., out-of-plane (plane-normal) polarization) are most common since this domain configuration is most effective for use in actuators, memory elements, and novel gates. However, the associated depolarization field particularly in thin films, compromises functionality and performance, even limiting the written state on the time scale of hours.

SUMMARY

Described herein are super-domain engineered materials such as dielectric meta-materials. Such engineering may include ordering of polarization. Ordering of spontaneous ferroelectric polarization, for example, is essential to non-volatile memories, piezoelectric transduction, and electro-optic devices, and in ferroelectrics operated at temperatures above their ferroelectric Curie phase transition temperature, hysteresis-free frequency-agile filters and antennas that function via voltage tuning of capacitance.

Engineering increases in dielectric, piezoelectric and ferroelectric properties have been realized through interfacially driven phenomena attained by arrangement of phases in superlattices, by engineering nanocomposites, or by engineering solid solutions designed to operate at or near a morphotropic phase boundary separating well-defined structural phases. In ferroelectric thin films, the extrinsic enhancement of susceptibility from domain wall pinning can be attained by strain engineering at room temperature through creation of a domain wall-rich film. The design and realization of a heterogeneous dielectric meta-material is presented that is distinguished by the phase proximity of and accessibility among two or more thermodynamically predicted ferroelectric domain wall variant types, or superdomain types.

The present disclosure describes how a phase boundary or a plurality or coincidence of two or more boundaries, e.g., a vertex, realized, for example, in strain-engineered ferroelectric thin films involving $aa_1/aa_2$ domains consisting of nano-twinned 90° polarizations lying diagonally within the film plane, yields responses that go well beyond property closures of the compounds' end members and the most superior single-phase domain-rich film. Compared with the current state-of-the-art in voltage-tunable dielectric thin film materials, domain wall-variant phase boundary-engineered in-plane polarized materials in high domain wall density over extended regions (superdomain(s)) exhibit significantly increased property values and figures of merit well beyond that of the solid solution compound in its ordinary incipient ferroelectric state. Increases in dielectric constant are more than two orders of magnitude. Electric field-tunable capacitance ratios exceed 16. Macroscopic ferroelectric polarization-electric field hysteresis can be suppressed without loss of local ferroelectric ordering.

In an example embodiment, a strained dielectric meta-material may be configured as a solid solution of a ferroelectric, the strained dielectric meta-material comprising at least one type of in-plane superdomain structure that is in phase-co-existence with, or in close phase proximity to, a paraelectric state achieved at zero electric field over a finite range of non-zero electric field. An end point of the finite range may be a dielectric breakdown point of the strained dielectric meta-material.

In an example embodiment, a strained dielectric meta-material may be configured as a solid solution of a ferroelectric, the strained dielectric meta-material comprising at least one type of in-plane superdomain structure that is in phase-co-existence with, or in close phase proximity to, a second phase state.

The strained dielectric meta-material may be configured as an end member of the ferroelectric. The ferroelectric may be configured to exhibit displacive and/or order-disorder ferroelectric characteristics at a predetermined temperature and pressure. A domain width of the at least one type of in-plane superdomain structure may be between 5 nm and 1000 nm. Domain width may including intervening end points. A domain width of the at least one type of in-plane superdomain structure may be between 5 nm and 100 nm, 5 nm and 200 nm, 5 nm and 300 nm, 5 nm and 400 nm, 5 nm and 500 nm, 5 nm and 600 nm, 5 nm and 700 nm, 5 nm and 800 nm, 5 nm and 900 nm, and/or ranges with intervening end points.

BRIEF DESCRIPTION OF THE DRAWINGS

FIG. 2(*b*) is a computer model showing the polarization direction of the PZT film by an arrow P, pointing from the film interior to the interface of PZT/SRO. The cation positions are indicated, Pb: green; Zr/Ti: red; Sr: violet; Ru: yellow. FIGS. 2(*a*)-2(*b*) are reproduced from *Nature Materials* 6(1) 64-69, 2007.

FIG. 4(*b*) illustrates a map of lattice rotations shows that the upper layers are more relaxed, and therefore more inclined, than those close to the interface. FIG. 4(*c*) illustrates the out-of-plane (plane-normal) strain showing a higher tetragonality in the right-hand side of the c-domain than in the left-hand side (obtuse). The difference arises from the local stress concentrations required to 'flatten' the interface of the ferroelastic film onto the substrate, as shown in the illustration of FIG. 4(*d*). FIGS. 4(*a*)-4(*d*) are reproduced from are reproduced from *Nature Materials* 10(12)963-967, 2011.

FIG. 5 illustrates a calculated polydomain phase diagram of average $P_3$ magnitude in $BST_{0.8}$, where the numbers denote different domains (e.g., FIG. 6) and the (red) dots correspond to the strain states $U_s=(a_{Sub}-a_{BST})/a_{BST}$ where $a_{BDT}=x\cdot a_{BT}+(1-x)\cdot a_{ST}$ on a (110) $SmScO_3$ (SSO) substrate at 300 K. (b) $\varepsilon_{33}$ of a BTO film at 300 K where the dashed and solid lines correspond to the intrinsic dielectric contribution and total permittivity, respectively. The phase diagram representing $BST_{0.8}$ follows accordingly. The domain illustrations for 1. c domain and for superdomain types 2. through 7., which are expected to be present in the as-grown state in the strained $BST_{0.8}$ films, are shown in FIG. 6.

FIG. 14(*a*) illustrates field dependent permittivity for samples with BST films with different Ba concentrations (x=0.19, 0.35, and 0.46). The inset shows the tunability as a function of field, n(E) (b,c) Field dependence of the quality factor Q (b), and of the commutation quality factor (c). Data measured at 1 MHz. Data for domain wall variant- and superdomain-engineered films is represented in the inset by the added purple line (100 kHz).

DETAILED DESCRIPTION

Figure 1:
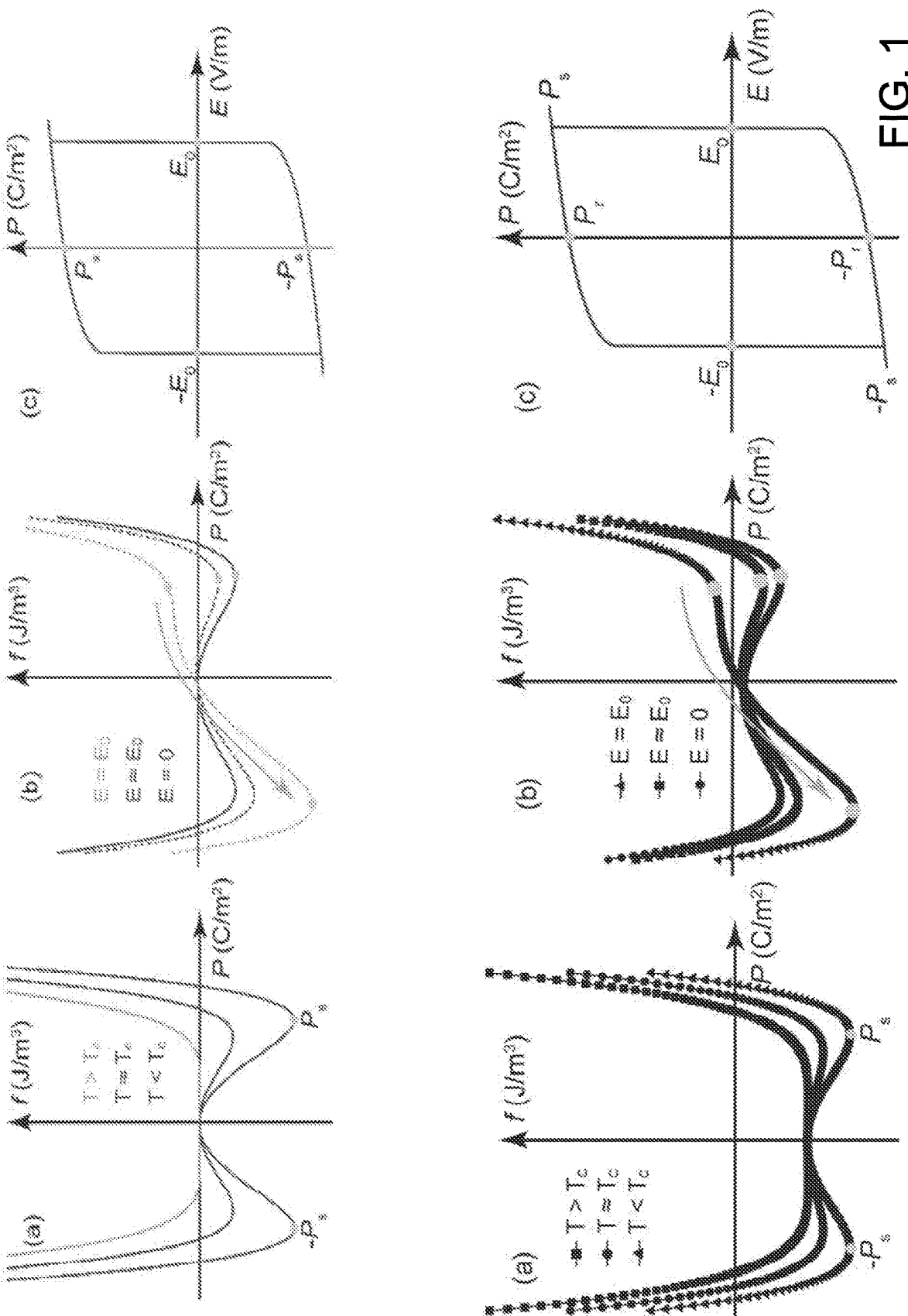
FIG. 1 illustrates plots of the free energy ($f$) vs. polarization (P), where (a) is the free energy $f$ of a ferroelectric is plotted as a function of the polarization P at $T \ll T_c$, $\approx T_c$ and $> T_c$; (b) illustrates the switching of Ps and the evolution of $f$ when an external electric field E is applied; and (c) illustrates a P-E hysteresis loop of a ferroelectric.

A ferroelectric has a spontaneous polarization $P_s$ lying in two or more equivalent directions below the Curie temperature $T_c$. This polarization may be switched to the opposite direction by an external electric field or stress. As an example, a ferroelectric crystal is paraelectric and in the cubic structure above $T_c$. This suggests the thermodynamic free energy $f$ is equivalent between the two opposite polarizations and is separated by a potential barrier, as shown in FIG. 1(a). As such, the switching between $P_s$ and $-P_s$ requires overcoming the potential barrier with a symmetry-lowering field: the stable state favoring ferroelectric ordering is altered by an electric field E and the potential barrier is lowered until E reaches the coercive field $E_0$ and the state changes to the opposite direction, as shown in FIG. 1(b). The switching process can be described by a typical ferroelectric hysteresis loop, for example, as shown in FIG. 1(c).

In particular, FIG. 1(a) illustrates the free energy $f$ of a ferroelectric as a function of the polarization P at $T \ll T_c$, $\approx T_c$ and $> T_c$. FIG. 1(b) illustrates the switching of $P_s$ and the evolution of $f$ when an external electric field E is applied. FIG. 1(c) illustrates an exemplary P-E hysteresis loop of a ferroelectric.

In the original state, the ferroelectric, without external stimulus (E), has a polarization either upward ($P_s$) or downward ($-P_s$). To flip/switch the polarization, an electric field E with opposite direction is applied and the polarization is decreased. As E increases up to the coercive field $E_0$, the polarization is pushed to the other direction and it saturates with even higher field. The integrated area inside the loop is the least energy to overcome the potential barrier.

Figure 5:
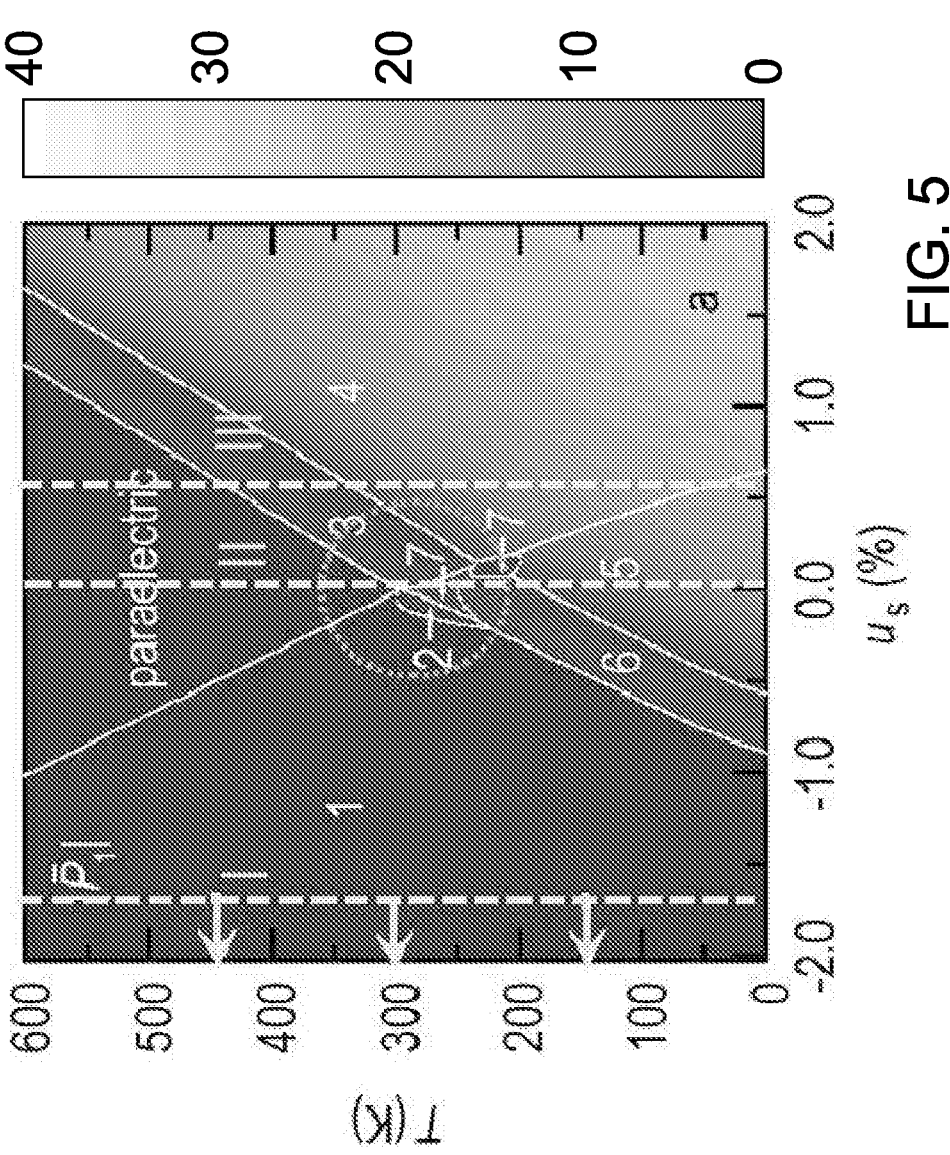
FIG. 5 illustrates strain-temperature-dependent domain wall-variant or superdomain phase diagram in a $Ba_{0.8}Sr_{0.2}TiO_3$ ($BST_{0.8}$) film.

$Pb(Zr,Ti)O_3$ (PZT), $BiFeO_3$ (BFO) and $BaTiO_3$ (BTO) are three exemplary ferroelectrics. For each of them, the thermodynamic phase (crystallographic structural phase, or domain/superdomain, by analogy) may be controlled by composition, strain, temperature and electric field. In the art of thin film technology, the strain imposed by the lattice-mismatching substrate can have a dominant effect on the evolution of a highly dense network of domains, termed superdomains, and the phase diagram is usually calculated as a function of strain and temperature as shown in FIG. 5. Although the domains in PZT and BFO have been extensively studied in the literature, $BaTiO_3$ remains relatively unexplored due to its relatively low Curie temperature $T_c$ (~120° C.) and large lattice constant (~4 Å). The small c/a ratio (nearly unity) as compared with other ferroelectrics makes experimental observation of fine local domain structure (i.e., superdomains) by the most popular methods, piezoresponse force microscopy and transmission electron microscopy, very challenging. The large lattice constant of BTO limits the degree of its epitaxial matching to among commercially available substrates.

Normal ferroelectric materials, i.e. crystals, belong to a class of solids that lack a center of inversion symmetry, and specifically have a permanent and re-orientable dipole moment per unit cell, or ferroelectric polarization. Among the most common ferroelectrics are those which exist in a simple or complex perovskite crystal structure, within which are structural variants (crystallographic phases) such as rhombohedral, orthorhombic, and tetragonal each of which may exist as a distinct thermodynamic phase within a phase diagram, i.e., defined by combinations of temperature and pressure, temperature and composition, temperature and strain, or multiple combinations of these variables. In principle, the orientation of ferroelectric polarization need not be aligned along a principle crystallographic axis, but the crystallographic phase determines, in the absence of a symmetry lowering field, the precise number of crystallographically and energetically equivalent directions in which the ferroelectric polarization can be oriented. For example, in the tetragonal phase, polarization may only be oriented in two different directions. However, in a rhombohedral phase, polarization may point along any of eight equivalent directions.

The presence of an external field, e.g., strain, can change the energy landscape, reducing the number of equivalent directions. For example, a uniform in-plane strain field (strain coherency) can be achieved by epitaxial growth of one material on another in such a manner so as to cause the polarization to be oriented preferentially some directions, e.g., in the plane of the film, or in the plane normal to the film, or other directions.

According to the Kittel law, minimization of total energy in a film may result in the formation of multiple ferroelectric domains of widths in accordance with the thickness of the film, wherein the polarization direction varies spatially along the film, typically in a stripe-like fashion. A particular domain is characterized by its orientation of ferroelectric polarization, and the width of this region of common polarization that is bounded by a domain wall. Domain wall types refer to the relative orientation of polarization in neighboring domains. Several experimental techniques have been employed to characterize the domain size (width or area) and its structure (orientation of polarization), and domain wall types. Among these, e.g., are polarized optical microscopy (if domains are large enough to be resolved), by PFM (including conventional single-frequency, dual amplitude resonance tracking and band excitation techniques, if domains are large enough and domain wall variants stable enough to be resolved), or by transmission electron microscopy (if the polar displacements in a given material are sufficiently large to provide the necessary contrast).

The region of the ferroelectric phase transition temperature $T_c$ is both scientifically interesting and technologically important. It is well known that a ferroelectric material, when heated (or cooled) to the range of the ferroelectric phase transition temperature, exhibits a significant increase in its thermodynamic and functional properties, such as dielectric permittivity, piezoelectric and electrocaloric responses. Large changes in polarization charge per unit of temperature change enable pyroelectric detectors of heat. A ferroelectric material exhibits voltage dependence to its dielectric permittivity, observable by a radio frequency (RF) capacitance measurement, showing hysteresis in the capacitance-voltage response, where application of electric field rotates the ferroelectric polarization and causes a reversible change in the permittivity. While this hysteresis, under saturation of polarization charge, is useful for non-volatile memories (ferroelectric random access memory, FeRAM), it is undesirable for voltage tuned RF capacitors that find application in antennas, filters, phase-shifters, etc.

The hysteresis can be suppressed, and permittivity and tuning property retained by operating at a temperature near, but just above, e.g., within 10% the material's $T_c$. However, it is not typically practical for an application such as a voltage-tuned capacitor to be able to be operated only at or near that particular temperature, which for $BaTiO_3$, is approximately 120° C. Many applications may require at or near room-temperature operability. Thus a common, well-known approach to mitigate the hysteresis is to modify a ferroelectric material by introducing one or more other non-ferroelectrically active cations, such as Sr on the A-site in $BaTiO_3$, producing ($Ba_xSr_{1-x}TiO_3$, or BST). This has the effect of lowering the $T_c$, approximately, according to the relative percentage of the two different A-site cations. An array of highly successful commercial technologies are based on BST films for tunable RF devices, such as passive tunable integrated circuits.

Recognizing that susceptibility is naturally large at and near $T_c$, the present disclosure relates to configurations where competition among multiple types of domain wall variants, which, in high density, constitute superdomains, permits a considerably higher density in the number and available orientations of ferroelectric polarization, and in well-controlled and re-orientable units that can be used to engineer an additive contribution to permittivity. A material (e.g., meta-material), as described herein, may be defined not by a single crystallographic and thermodynamic phase or boundary between two thermodynamic crystallographic phases, whether having ferroelectric ordering or not. Compositions of matter may be defined specifically by their close proximity to a thermodynamic boundary separating two or more phases each of which is not crystallographic or structural, but a high density of so-called domain wall variants, or a superdomain. Here model calculations allow for identification of combinations of chemical compositions, strain and temperature that allow evolution of an extraordinarily high density of two or more selected co-existing superdomain types.

The Landau-Ginzburg-Devonshire (LGD) theory may be applied to calculate thermodynamic domain wall variant, or superdomain, phases and to predict conditions that may satisfy design goals to create a material distinguished by its manifold of domain wall variant or superdomain types.

As an example, $BaTiO_3$ may be mixed with $SrTiO_3$ to form ($Ba,Sr)TiO_3$ (BST) solid solution, the latter end member compound being an incipient ferroelectric, a material whose ferroelectric ordering is suppressed by quantum fluctuations. The intention is to reduce its lattice constants so that mating with various candidate substrates (e.g., $SmScO_3$) is possible. Second, among candidates, a candidate may be selected that brings the $T_c$ of BST to just above room temperature, that is, to reside just within a ferroelectric phase (domain wall variants or superdomain types 2 through 7 in FIG. 5) as for $BST_{0.8}/SmScO_3$ which is very close to the boundary of paraelectric phase.

Figures 2A, 2B:
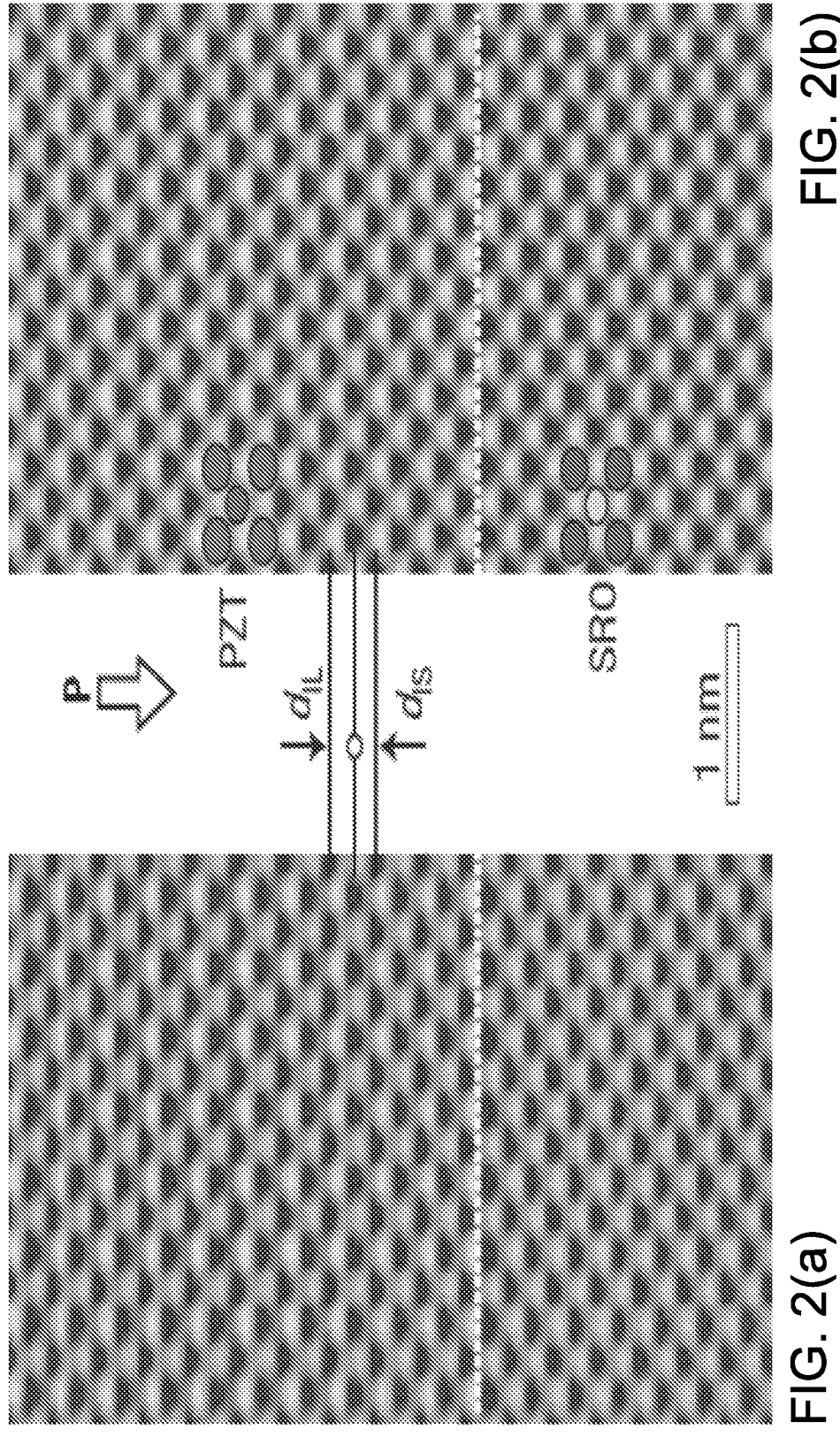
FIG. 2(*a*) illustrates a state of the art transmission electron microscopy (TEM) image of forty-two (42) unit cells of lead zirconate titanate (PZT) grown on a $SrRuO_3$ (SRO) film electrode where the white dashed line represents the boundary between PZT and SRO layers.

As an illustrative example of the polarization $P_s$ in a perovskite oxide ($ABO_3$ where A is a metal cation, B a transition metal cation), a state of the art TEM image of a $Pb(Zr_{0.8}Ti_{0.2})O_3$ (PZT) is shown in FIG. 2 (reproduced from *Nature Materials* 6(1) 64-69, 2007). The polarization in PZT may be induced by the relative displacement of the B-site cations. If the temperature exceeds $T_c$, the B-site ions may be placed at the center and no macroscopic polarization may be observed. The bottom $SrRuO_3$ (SRO) layer is not ferroelectric but serves as an oxide electrode. In a switching experiment, another layer of SRO or other metals (Au, Pt, etc.) are deposited and the electric field is applied between the top and bottom electrodes. The polarization switching is accompanied principally by the upward/downward displacement of the B-site ions (Ti in the present example), and possible other displacements by other cations and the oxygen anions. For a specific ferroelectric, the B-site cations can be positioned in different spatial equivalent coordinate at different temperature.

FIG. 2($a$) illustrates a TEM of forty-two (42) unit cells of PZT grown on $SrRuO_3$ (SRO) electrode where the (white) dash line represents a boundary between PZT and SRO layers. FIG. 2($b$) illustrates an image calculated on the basis of the computer model. The polarization direction of the PZT film is shown by an arrow P, pointing from the film interior to the interface of PZT/SRO. The cation positions are indicated, Pb: green; Zr/Ti: red; Sr: violet; Ru: yellow.

Figure 3:
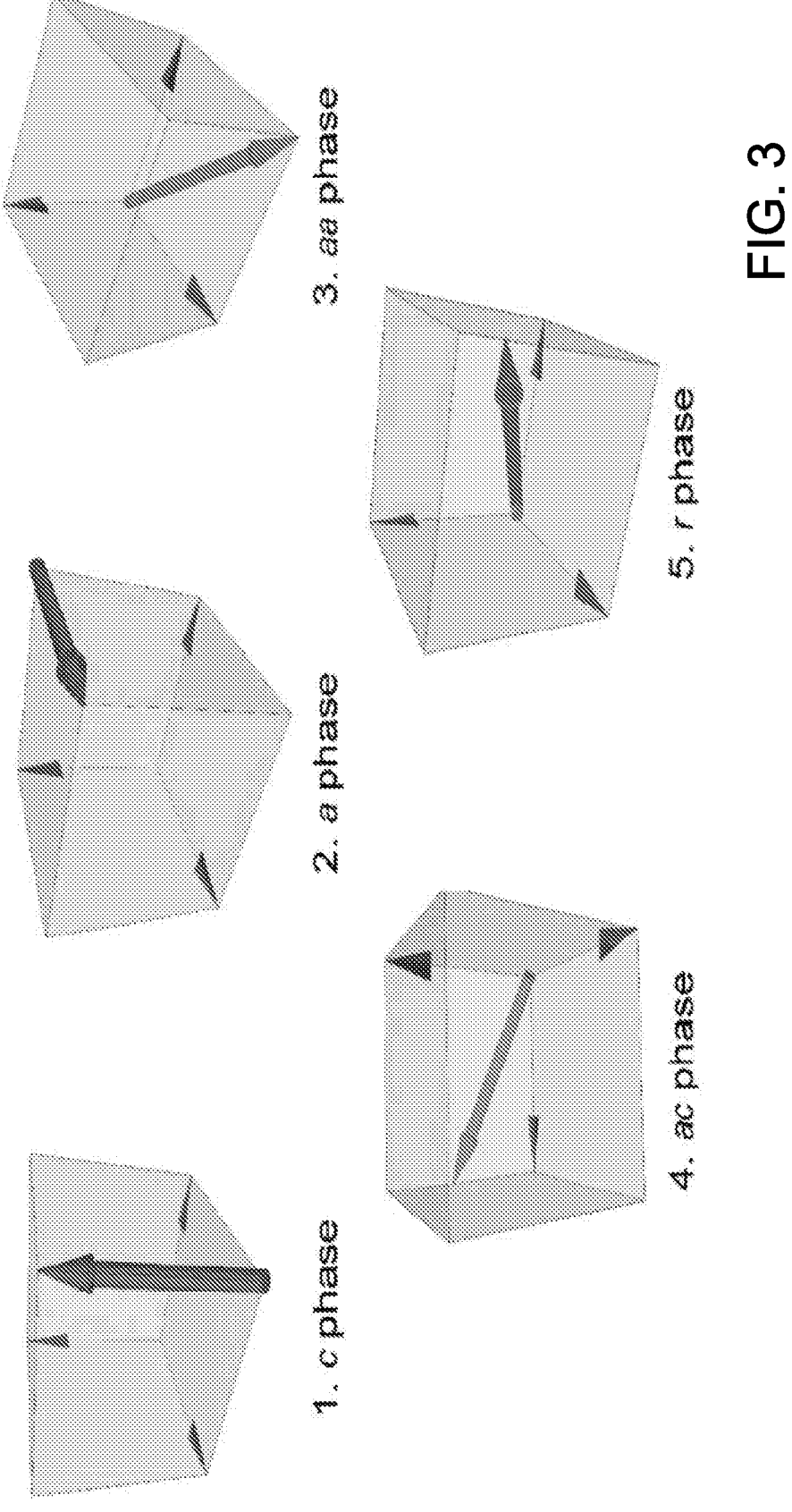
FIG. 3 illustrates 1. c phase: $(0, 0, P_3)$, 2. a phase: $(P_1, 0, 0)$, 3. aa phase: $(P_1, P_2, 0)$ where $P_1=P_2$, 4. ac phase: $(P_1, 0, P_3)$, 5. r phase: $(P_1, P_2, P_3)$ where $P_1=P_2$. $P_i(i=1, 2, 3)$ using the Voigt notation represents the polarization magnitude.

For example, the phase (domain) is called tetragonal in the above image, where the B ions are in [001] or [0, 0, −1] (or equivalent [100] [010]) direction. Orthorhombic means the polarization can be decomposed to any two orthogonal directions in the Cartesian coordinate and the magnitude in each direction is not necessarily identical. Rhombohedral means a combination of the three Cartesian coordinates and at least two components have identical magnitude. Some typical illustration of these phases (domains) and their nomenclature are shown in FIG. 3, illustrating: 1. c phase: $(0, 0, P_3)$, 2. a phase: $(P_1, 0, 0)$, 3. aa phase: $(P_1, P_2, 0)$ where $P_1=P_2$, 4. ac phase: $(P_1, 0, P_3)$, 5. r phase: $(P_1, P_2, P_3)$ where $P_1=P_2$.

The change of the electric displacement D ($=\varepsilon_0E+P=\varepsilon_0 (1+\chi_e)E=\varepsilon_0 \varepsilon_r E$) with the electric field E is characterized as the dielectric permittivity $\varepsilon=dD/dE=\varepsilon_0 \varepsilon_r, \chi_e=dP/dE$, where $\varepsilon_0$ and $\varepsilon_r$ are the dielectric permittivity of vacuum and the relative dielectric constant, respectively, $\chi_e$ is the dielectric susceptibility, and P is the polarization. Compared with a dielectric, a ferroelectric always shows much higher permittivity and can exhibit extraordinary tunability. For example, the ($Ba,Sr)TiO_3$ (BST) family, due to at least the low coercive field (~100 kV/cm) and $T_c$ (<120° C.), is widely used as microwave components. On the other hand, the $Pb(Zr, Ti)O_3$ (PZT) family with a robust remnant polarization (~70 $\mu C/cm^2$) and high $T_c$ in the range of 200° C. to 400° C. serves as an excellent candidate for non-volatile memory application and as a piezoelectric transducer. Though ferroelectrics in bulk ceramic form have been successfully employed in many applications, their polycrystalline microstructure and large grains result in a more (or fully) random distribution of polarization orientation, and the pre-poling of the crystal is necessary; the switching voltage is scaled up with the crystal thickness and power dissipation can be problematic. These incompatibilities make the bulk impossible to be integrated into a nanoelectronic device. However, these issues can be addressed by using ferroelectrics in thin film form.

Such films can be grown on a lattice-mismatching substrate and some of the film properties, which cannot be found in the bulk, can be engineered through epitaxy. The mismatching with the substrate confers substrate-induced strain in the films, and the compressive strain is always preferred involving a simple c domain where the polarization points in the out-of-plane (plane-normal) direction. The geometry facilitates enhancements in $P_s$ and $T_c$ relative to the bulk, highly advantageous for non-volatile memory and novel gate for underlying conducting channels, e.g. graphene, carbon nanotubes, $MoS_2$, semiconductor nanowires and conventional metal-oxide-semiconductor field effect transistors (MOSFETs). However, the actual domain in those films can be a combination of these simple domains shown in FIG. 3.

Figure 4:
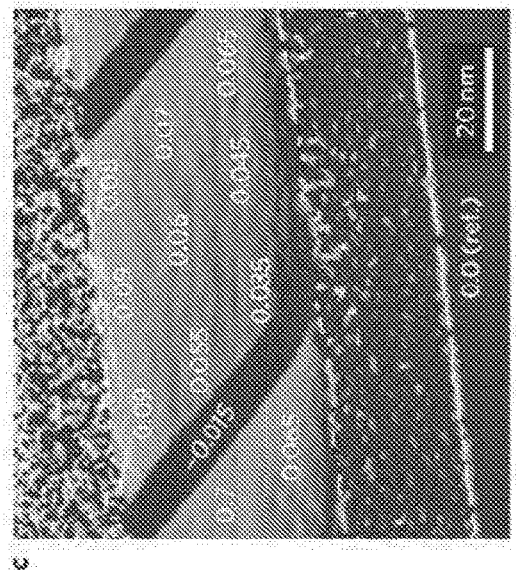
FIG. 4(*a*) illustrates a state of the art TEM image showing the structure of the $PbTiO_3$ thin film grown on a $SrRuO_3$ buffer layer deposited on a $DyScO_3$ substrate.
Figure 4:
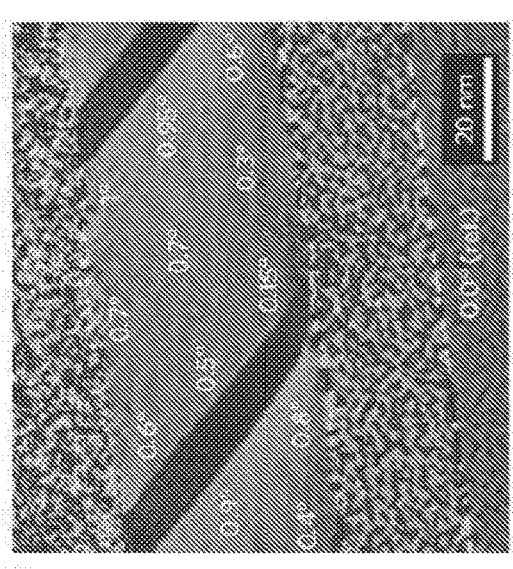
Figure 4:
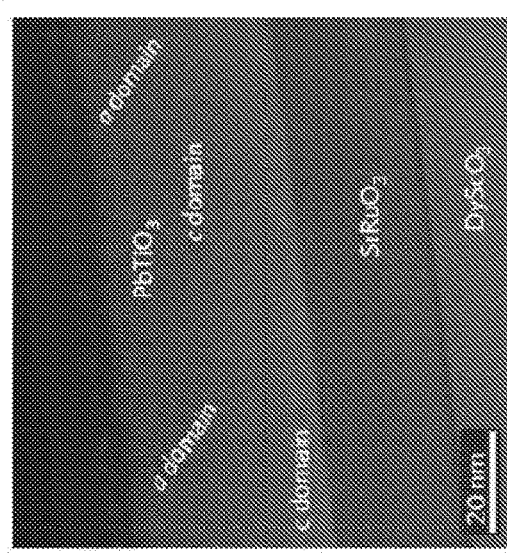
Figure 4:
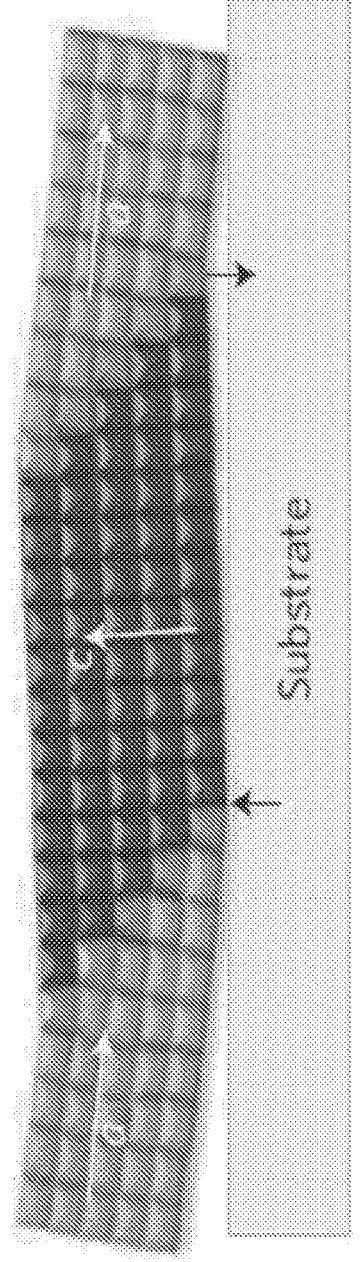

FIG. 4 (reproduced from *Nature Materials* 10(12)963-967, 2011) (a) illustrates a TEM image showing the structure of the $PbTiO_3$ thin film grown on a $SrRuO_3$ buffer layer deposited on a $DyScO_3$ substrate. FIG. 4(*b*) illustrates a map of lattice rotations shows that the upper layers are more relaxed, and therefore more inclined, than those close to the interface. (c), The out-of-plane (plane-normal) strain shows a higher tetragonality in the right-hand side of the c-domain than in the left-hand side (obtuse). The difference arises from the local stress concentrations required to 'flatten' the interface of the ferroelastic film onto the substrate, as shown in the illustration.

In an epitaxial film, the film thickness and the orientation of the substrate can significantly change the film properties. $PbTiO_3$ films ($a_{PZT}$=3.97 Å) may be compressively strained on $DyScO_3$ substrate ($a_{DSO}$=3.95 Å) to form one or more c domains. A complex c/a/c/a domain, where the sub-a domain with a polarization lying in the plane next to the sub-c domain by 90° domain wall may be observed in the films. This discrepancy can be well explained in the framework of the phenomenological Landau-Ginzburg-Devonshire (LGD) model. The key idea is that a combination of simple domains possesses a lower free thermodynamic energy as compared with having only a simple domain. In other words, the film with a lower free energy exhibits increased stability.

As an example, films may be designed to be located on the boundary of two or three phases including, but not limited to, the so-called $aa_1/aa_2$, c and paraelectric phases. One can simply imagine at these intersection points, the free energy differences among these competing phases are small, and it directly leads to the co-existence of these phases.

Increased out-of-plane (plane-normal) dielectric constant $\varepsilon_{33}$ can be obtained using in-plane domain structures: the polarization-energy landscape can favor easy rotation of the polarization vector from in-plane to out-of-plane (plane-normal) polarization ($P_3$) upon application of a small electric field $E_{3-app}$ in the plane-normal direction as compared with that within a c domain in which an initial displacement is already stabilized by the compressive strain from the substrate, as shown in FIG. 5 where the tensile strain on the right, with the same magnitude as the compressive on the left, has higher $\varepsilon_{33}$. The $BaTiO_3$ (BTO)-based family of ferroelectrics (Ba,Sr)$TiO_3$ may be selected as a candidate because of much its lower coercive field as compared with $Pb(Zr,Ti)O_3$ and $BiFeO_3$. In addition, a secondary contribution to $\varepsilon_{33}$ from multiple phase changes and their effect on domain wall pinning in BTO at low temperature can be expected. However, domain wall variant- and superdomain-engineered incipient ferroelectric dielectric materials may be attainable in other complex oxide perovkites $Pb(Zr,Ti)O_3$ and $BiFeO_3$ by substitutional introduction of A and/or B site cations and similarly identifying structures in phase space that permit co-existence of two or more domain wall variant and superdomain types, with or without the paraelectric phase.

Figure 6:
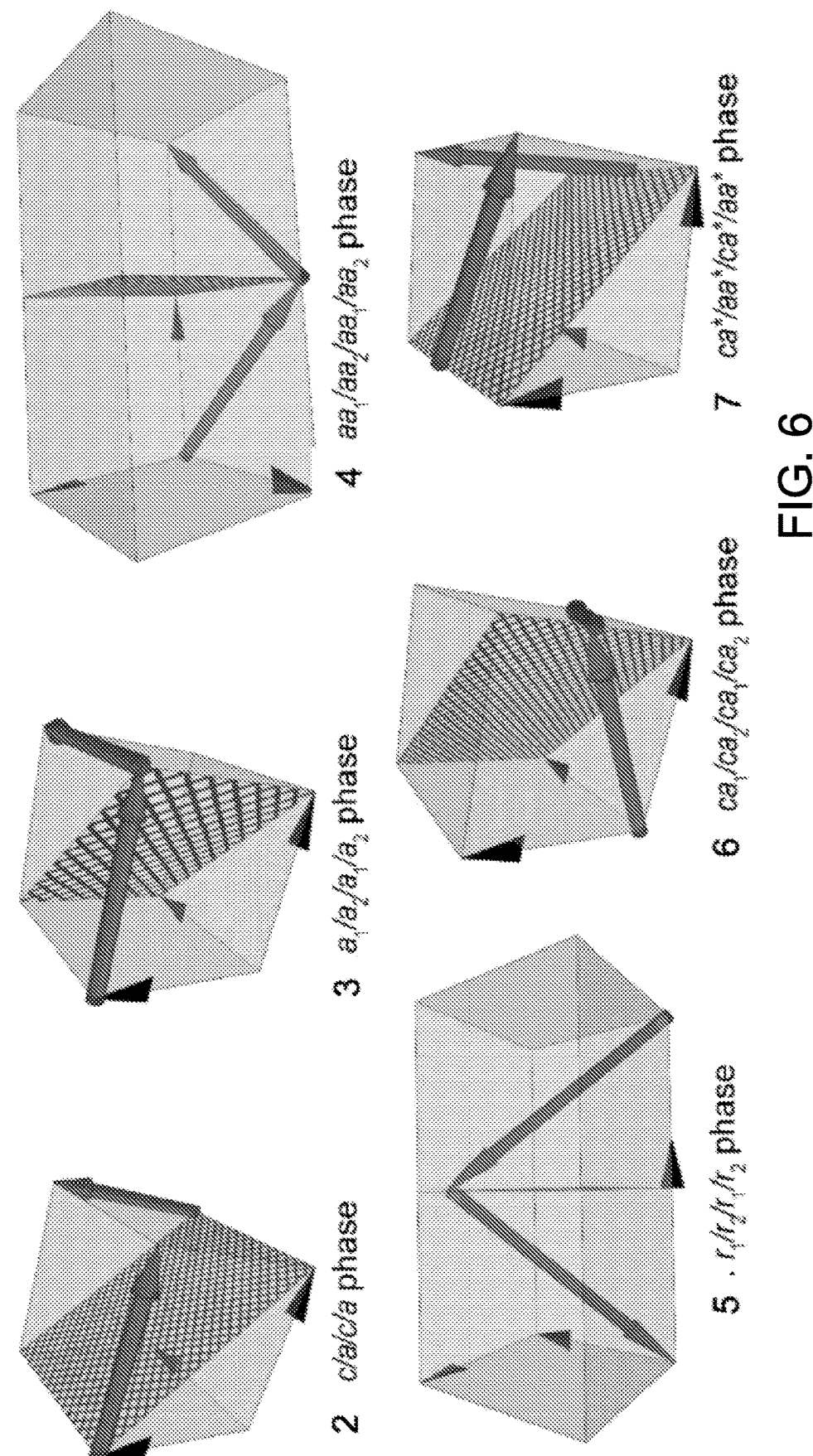
FIG. 6 illustrates polarization orientation in ferroelectric domain wall variant or superdomain structures in a strained polydomain $BST_{0.8}$ film. The illustrations correspond to superdomain structures denoted in the calculated thermodynamic phase diagram presented in FIG. 5. As explained in the text, experimental evidence indicates the presence of domain wall variant or superdomain type 4 (instead of 3), and/or the state is more likely characterized by a manifold of coexisting domain wall variant types or superdomain types each of which have polarization correlation lengths that are too short and/or polarization directions associated with domain wall variants too energetically delicate to be resolved using piezoresponse force microscopy (PFM), the latter owing to the highly localized electric field concentration resulting from the probe tip, which can favor imaging of certain domain wall variants over others, based in part on the relatively flat polarization-energy landscape.

Thermodynamic model calculations support the hypothesis that the largest plane-normal permittivity values can be obtained via in-plane domains (FIG. 5). The phenomenological Landau-Ginzburg-Devonshire (LGD) model (Appendix) may be used to construct the poly-domain phase diagram of BTO, BST and their dielectric permittivity. BST has a rich phase diagram over strain $U_s$ and temperature T where each domain type is denoted by a number (FIG. 5 and FIG. 6). The color maps denote the average magnitude of $P_3$ and the film strain states at 300 K on (110) $SmScO_3$ ($a_{SSO}$=3.99 Å) substrates where an average value of the slightly anisotropic in-plane lattice constants along (110) and (001) is taken. Epitaxial growth of BTO ($a_{BTO}$=4.006 Å) on most substrates produces c domain formation in BTO ($a_{BTO}$=4.006 Å).

A series of $Ba_xSr_{1-x}TiO_3$ ($BST_x$) may be generated, where the lattice constant is reduced by well-known substitution of Sr so as to shift the strain state to a higher tensile strain. The calculated phase diagram of $BST_{0.8}$ is shown in FIG. 5. The strain states on SSO at 300 K fall into so-called $a_1/a2$ or $aa_1/aa_2$ domain as illustrated in FIG. 5. Since the complex orthorhombic $ca_1/ca_2$ and rhombohedral $r_1/r_2$ phases inherited from BTO are prevalent over lower T and an intermediate $U_s$ region, $BST_{0.8}$/SSO is an excellent candidate for observing migration of domain evolution to low T. In this case the individual domain evolution path is nearly a vertical line along T since the difference in the thermal expansions between the films and the substrates is relatively small compared with the strain at 300 K.

Figure 7:
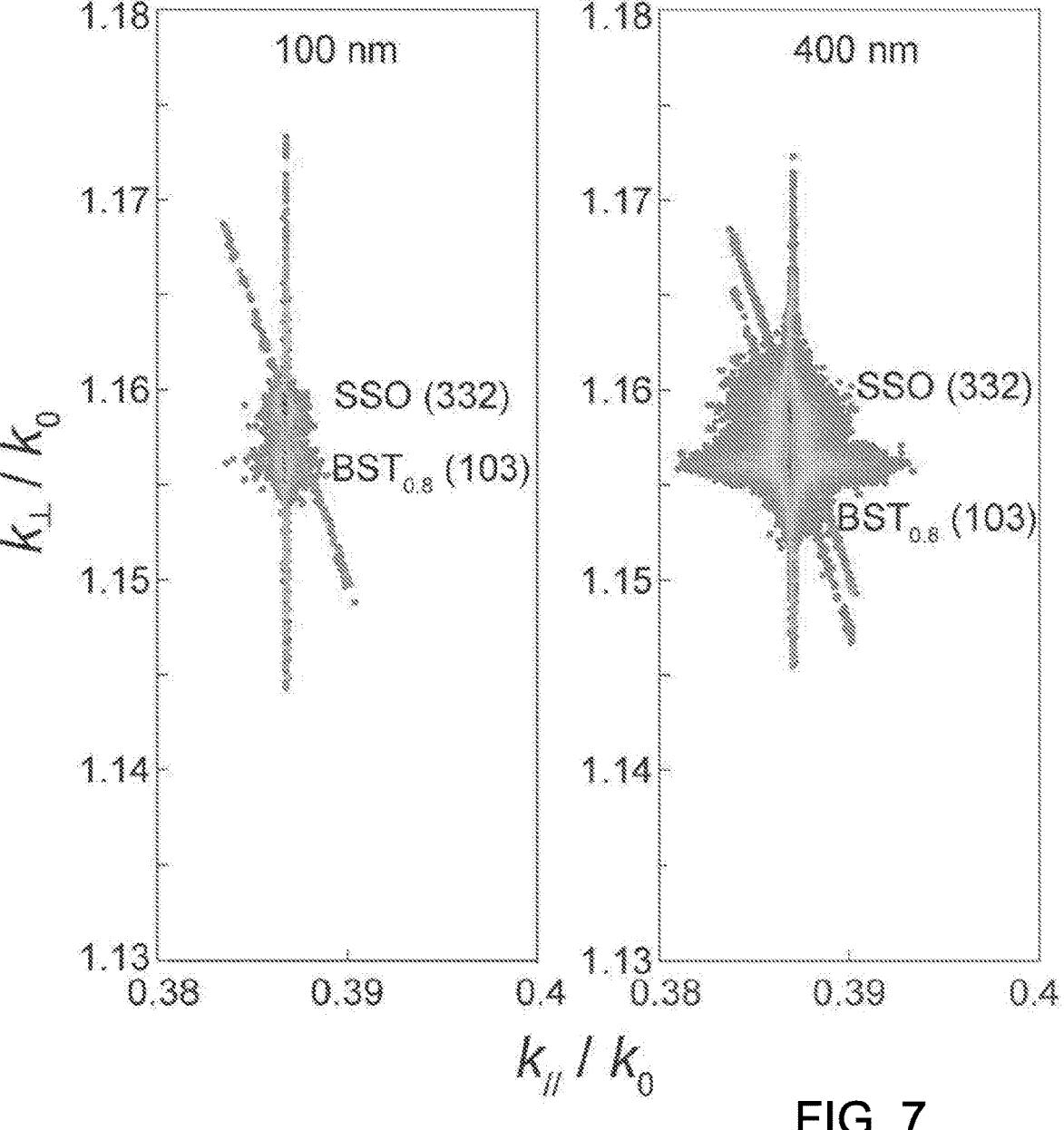
FIG. 7 illustrates reciprocal space maps (RSMs) of (103) peaks of the $BST_x$ films with respect to the (332) peak SSO for $BST_{0.8}$. The horizontal axis is $k_{//}/k_0$ and the vertical $k_\perp/k_0$. These RSM maps demonstrate that the films are coherently strained.

Epitaxial $BST_x$ films (x=0.8) of thicknesses ranging from 20-400 nm were deposited on SSO substrates and on SSO substrates possessing a lattice-matched bottom electrode material. Capacitors were produced in metal-insulator-metal (MIM) and co-planar interdigitated capacitor (IDC) configurations, the latter using lithographically patterned sputtered Au-capped Cr/Ag films (~750 nm) as low-loss electrodes. X-ray diffraction (XRD) measurements confirm that deposited films are single-phase (See, e.g., Appendix) and the reciprocal space mappings (RSMs) are employed to study the extent to which the strain is preserved (FIG. 7). The film is coherent with respect to the substrate.

FIG. 7 illustrates reciprocal space maps (RSMs) of (103) peaks of two $BST_{0.8}$ films with respect to (332) peak of SSO for $BST_{0.8}$. The horizontal axis is $k_{//}/k_0$ and the vertical $k_\perp/k_0$. All films are coherently strained.

Figure 8:
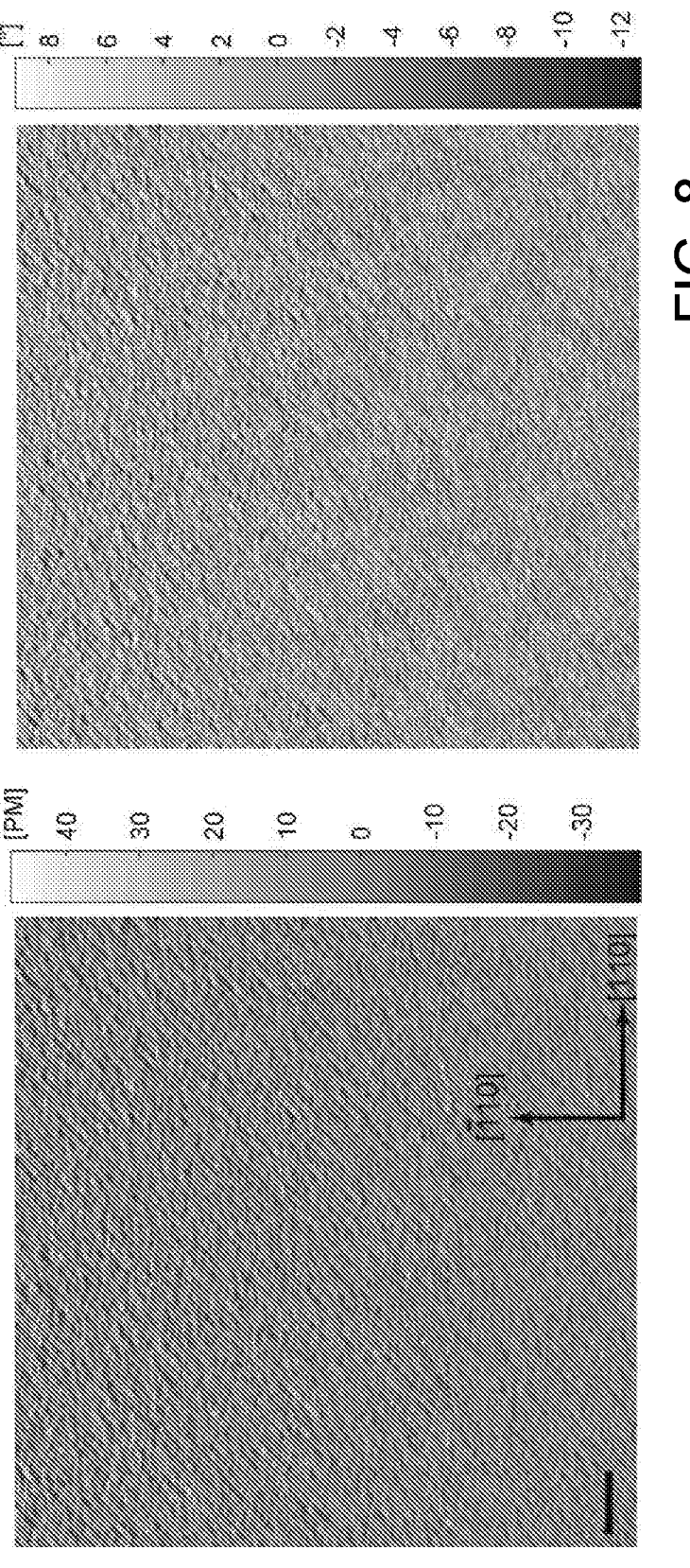
FIG. 8 illustrates imaging of predicted in-plane domain structure. The PFM [Amplitude×Cos(θ)] of $BST_{0.8}$ on SSO. The scale bar is 1 μm. The in-plane domains are all $aa_1/aa_2$ types, and the domain periodicities may decrease under higher tensile strain.

As shown, the out-of-plane (plane-normal) lattice constants of the $BST_{0.8}$ film on SSO is smaller than the bulk in-plane domain formation. Lateral dual-amplitude PFM is employed to probe the in-plane domain structure in the films at 300 K. All the samples are mounted diagonally and the scan angle is set to 0° and then 45° to eliminate the possibility of scan angle-induced artifacts in the observed patterns. The domain structure of $BST_{0.8}$ on SSO is shown in FIG. 8. The stripes are along the diagonal indicating the domain walls lie in either [100] or [010] directions, consistent with the $aa_1/aa_2$ domain (FIG. 6, type 4). In FIG. 5, films on SSO are predicted to include or be exclusively in the $a_1/a2$ phase, however, this particular domain wall variant, or superdomain phase, is not apparent in PFM. This inconsistency can arise from adoption of average values of anisotropic in-plane lattice constants in SSO in the calculation, and the growth can also shift the actual strain state to the $aa_1/aa_2$ domain. In fact no evidence of the exchange between $aa_1/aa_2$ and $a_1/a2$ phases is observed in the heating-cooling cycle. This suggests that the stripe of $a_1/a2$ domain in the phase diagram (region 3, FIG. 5) can be replaced by $aa_1/aa_2$ (region 4, FIG. 3).

FIG. 8 illustrates imaging of calculated in-plane domain structures, specifically the PFM [Amplitude×Cos(θ)] of $BST_{0.8}$ on SSO. The scale bar is 1 μm. The in-plane domains include the $aa_1/aa_2$ type, and the domain periodicity decreased under higher tensile strain.

Figure 9:
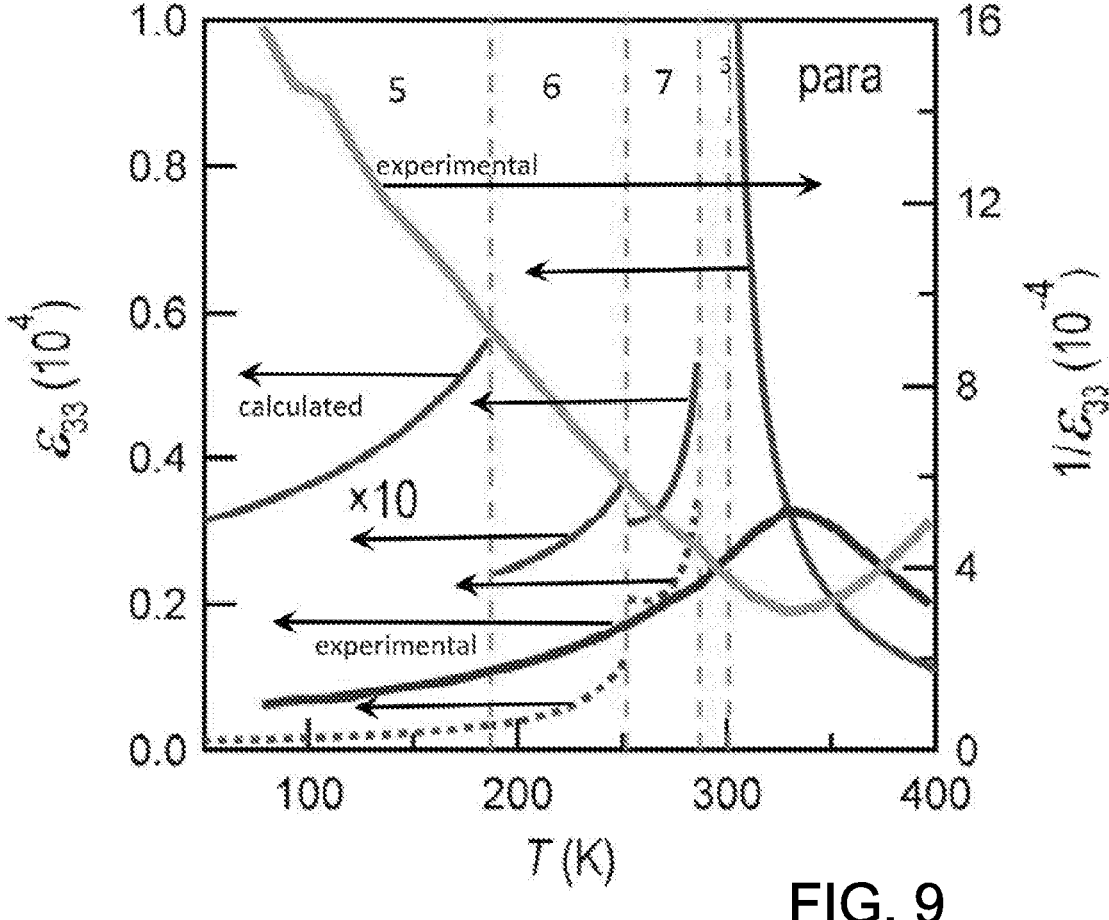
FIG. 9 illustrates a comparison of measured and calculated $\varepsilon_{33}(T)$ in $BST_{0.8}$/SSO. All films were measured in a metal-insulator-metal (MIM) parallel-plate capacitor structure. The solid and dashed blue lines correspond to the total permittivity and the intrinsic contribution, respectively. The solid green is the experimental value and the solid red the inverse of the experimental value, which is used to determine the Curie temperature $T_c$.
Figures 10A, 10B:
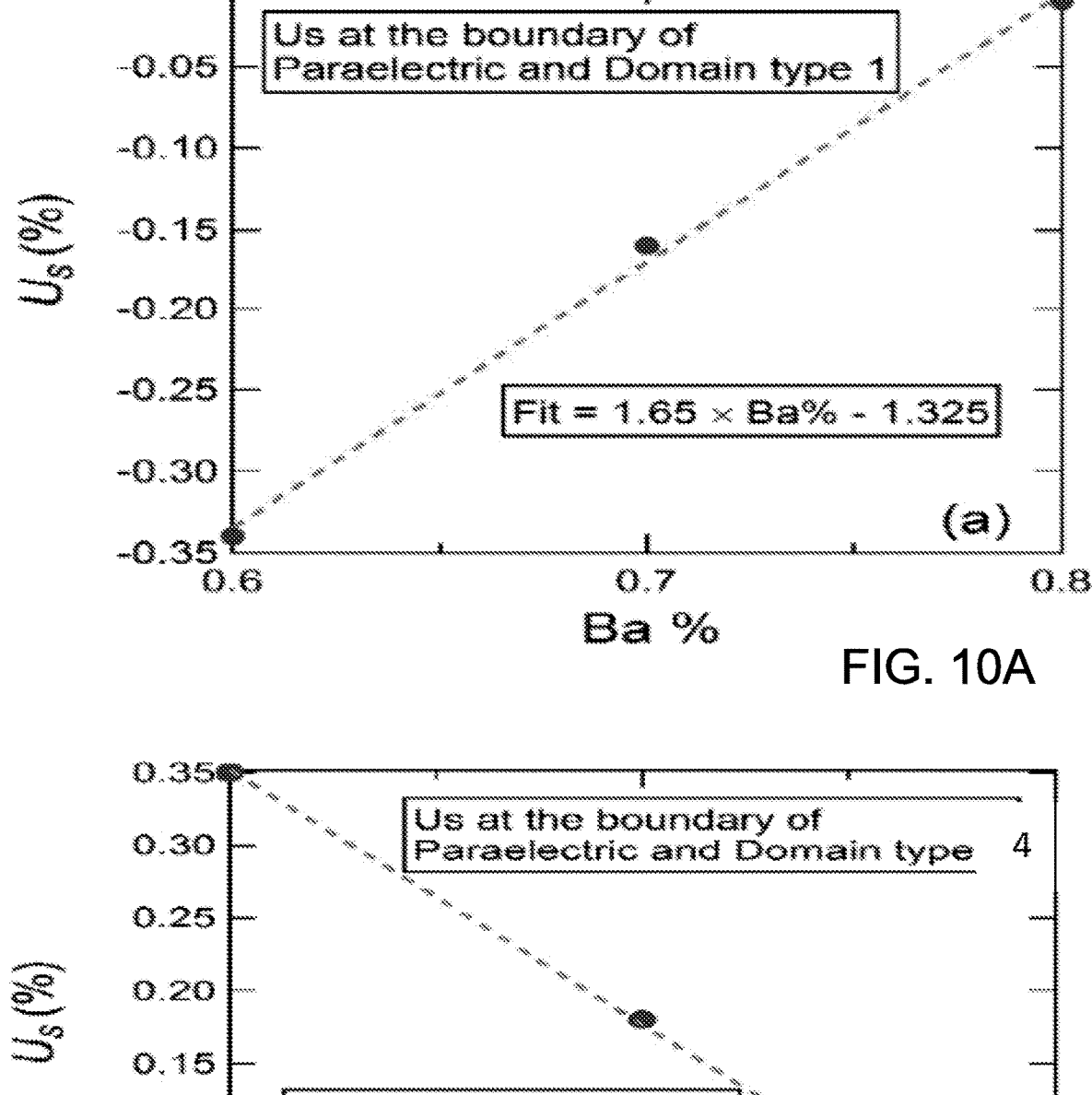
FIGS. 10(*a,b*) illustrate plots of the strain states $U_s$ vs. percent loading of Ba at the boundary of the paraelectric phase and c domain (the domain type 1 in FIG. 5), and the paraelectric phase and $aa_1/aa_2$ domain (the domain type 6 in FIG. 5), respectively. For example, to have a superdomain type 6 in BST at 300K the fit reveals that the boundary is at $U_s(\%)=-1.75\times Ba\ \%+1.4$. In practice, the strain $U_s=(a_{sub}-a_{BST})/a_{BST}$ where $a_{sub}$ is the substrate lattice constant and $a_{BST}$ is the lattice constant of the BST solid solution. $a_{BST}$ can be easily evaluated as $x\cdot a_{BTO}+(1-x)\cdot a_{STO}$ where $a_{BTO}=4.006$ Å and $a_{STO}=3.905$ Å. Given the boundary $U_s$ of a specific Ba ratio, the available substrates can be chosen by evaluating the practical $U_s$.

FIG. 9 illustrates plots of measured and calculated $\varepsilon_{33}$ in films, comparing measured and calculated $\varepsilon_{33}(T)$ in $BST_{0.8}$ deposited on SSO. The solid and dashed lines correspond to the total permittivity and the intrinsic contribution, respectively. Regardless of Ba/Sr ratio, $\varepsilon_{33}$ in the tensile strain may be higher than the compressive. A secondary contribution to $\varepsilon_{33}$ from domain wall pinning at low T is verified in $BST_{0.8}$/SSO.

The derived and measured $\varepsilon_{33}$ of the BST films of each composition as a function of T is shown in FIG. 9 where the solid blues are the total $\varepsilon_{33}$ from LGD model, the dashed blues the intrinsic contribution. The solid green lines correspond to the measured data, and the red correspond to the reciprocal measured data. As seen the figure, correspondence of the location of the calculated/predicted and measured peaks is excellent.

The BST phase diagrams and their domain formation may be estimated/calculated on an SSO substrate. Epitaxial films of these compositions may be produced on corresponding substrates using physical vapor deposition. A set of measurements may be used to characterize the film thickness, crystallographic orientation, strain and degree of strain coherence, and scanned proximal probe microscopy to examine the ferroelectric domains/superdomains. The so-called $aa_1/aa_2$ domain (superdomain type 4) is orthorhombic and has never been experimentally reported in the $BaTiO_3$ and BST thin film system. It is also noted that $aa_1/aa_2$ domain lies in 4 equivalent face diagonal directions in the plane [110] and can only exist in $BaTiO_3$ and BST system.

By using the derived LGD model, one may quantitatively determine the ferroelectric domain wall-variant-paraelectric boundaries associated with a specific Ba:Sr composition ratio, e.g., at paraelectric phase and domain wall variant or superdomain type 1 (possessing plane-normal polarization), and at paraelectric and superdomain type 4 (possessing in-plane diagonal polarization), at 300 K. The calculated results for selected example compositions are listed in Table 1 below:

TABLE 1

| Ba:Sr ratio in % | $T_c$ (K) | Us (%) at the boundary of para & domain type 1 at 300K | Us (%) at the boundary of para & domain type 4 at 300K |
|---|---|---|---|
| 60/40 | 221 | −0.34 | 0.35 |
| 70/30 | 258 | −0.16 | 0.18 |
| 80/20 | 298 | −0.01 | 0 |

With the above three points in Table 1, one may linearly extrapolate any other Ba:Sr composition shown in the figure above. For example, to have a superdomain type 4 in BST at 300K the fit reveals that the boundary between $aa_1/aa_2$ and paraelectric phases is $U_s$ (%)=−1.75×Ba %+1.4. In practice, the strain $U_s=(a_{sub}-a_{BST})/a_{BST}$ where $a_{sub}$ is the substrate lattice constant and $a_{BST}$ is the lattice constant of the BST solid solution. $a_{BST}$ can be easily evaluated as $x \cdot a_{BTO}+(1-x) \cdot a_{STO}$ where $a_{BTO}$=4.006 Å and $a_{STO}$=3.905 Å.

Based on the above and consideration of commercially available substrates one can easily identify which substrate(s) can provide the expected strain states within the boundary.

Although the LGD model serves as a guidance for dense domain wall variant or superdomain creation, several practical considerations may be used in addition, or alternatively. For example, domain type 1 in $BST_{0.8}$ on $LaAlO_3$ substrate is predicted in the model. However in reality, the strain may not be preserved as the film becomes thicker and exceeds the so-called "critical thickness" above which the film accommodates the mismatching with the underlying substrate by strain relaxation. The higher the mismatch, the shorter the length scale over which the relaxation occurs. As an illustrative example, the BST films possessing within 1.5% compressive or tensile strain can persist for thicknesses up to 120 nm with a bottom electrode layer. 300 nm $BST_{0.8}$ may be directly grown on SSO without observing strain relaxation.

To maintain the delicate strain state, the substrate may be attached to the film.

Dielectric Permittivity

Dielectric permittivity values for domain-engineered thin films of the present disclosure far exceed the state-of-the-art in thin films. Calculated/predicted values for relative dielectric permittivity $\varepsilon_{33}/\varepsilon_0$ exceed 10,000, reaching $10^5$ for selected combination(s) of substrate-induced strain, composition, and temperature. Experimentally, in the range of 1 kHz to 1 MHz, measured dielectric permittivity values are $\varepsilon_{33}/\varepsilon_0 \approx 3,000$. These room-temperature experimentally measured values (using a metal-insulator-metal geometry, and thickness is known to within a few nm) are more than twice as high as highest reported value state-of-the-art film of comparable thickness ($\varepsilon_{33}/\varepsilon_0 \approx 1,300$) for any composition of $BST_x$ (see FIG. 12) at room temperature.

Dielectric Tunability

Tunability may be one of the key figures of merit (FOM) for a tunable capacitor. Enhanced dielectric permittivity promotes enhanced capacitance tunability, which is defined for a particular field or voltage by $n=C_{max}/C_{min}=\varepsilon_{max}/\varepsilon_{min}$. Alternatively, a relative dielectric tunability is expressed as $n_r=(C_{max}-C_{min})/C_{min}=(\varepsilon_{max}-\varepsilon_{min})/\varepsilon_{min}$. The dielectric tunability (or relative tunability) of the designed meta-dielectric materials can be predicted/calculated (Appendix). The low-frequency static capacitance-voltage (C-V) relationship in c, paraelectric, $a_1/a_2$ and $aa_1/aa_2$ phases can also be derived within the phenomenological LGD theory. For $a_1/a_2$ and $aa_1/aa_2$ domains with voltage $V_3$ applied in the plane normal, the electrical boundary condition becomes the electric field $E_3=\varphi \cdot E_3'+(1-\varphi) \cdot E_3''=V_3/d$ where $E_3$, $E_3'$ and $E_3''$ are the average electric field and the fields in the first and second subdomains respectively, d is film thickness and $\varphi$ the volume fraction. Polarization $P_3'$ and $P_3''$ are introduced and m, defined as the ratio of $P_3'$ ($P_3''$) over $P_1'$ ($P_1''$), is taken into account for the domain wall plane. The other boundary conditions remain unchanged and the expression of the total free energy is updated accordingly. The numerical solutions of $P_1'$ ($P_1''$) and m are sought by the free energy minimization using the Newton iterative method, suggesting $P_1'=P_1''$. For the simple c-domain phase, an additional $-E_3 \cdot P_3$ term is added to the free energy assuming no depolarization field. The coercive field is found by the disappearance of one of the two minima in the free energy—polarization curve and $P_3$ is solved numerically. Unlike c phase, the paraelectric has a singularity in the minimum. A similar approach can be pursued to address the in-plane response.

The dielectric material configured in accordance with the present disclosure may exhibit in-plane or plane-normal dielectric tunability ratio of n=5:1 to n=10:1, and n=10:1 to n=20:1, and n=20:1 to n=50:1 and n=50:1 to n=100:1, and n=100:1 to n=200:1. Such tenability ratios may be in maximum fields of 50-100 kV/cm, 100 kV/cm to 200 kV/cm, 200 to 500 kV/cm, or 500 to 1000 kV/cm (0.5 to 1 MV/cm), for example. Such tenability ratios may be at 293K (e.g., room temperature), between 4K and 100 K, between 100 K to 150 K, 150 K to 200 K, 200 K to 400 K, or 400 K to 800 K. Other ratios, fields, and temperatures may be used.

Figure 11A:
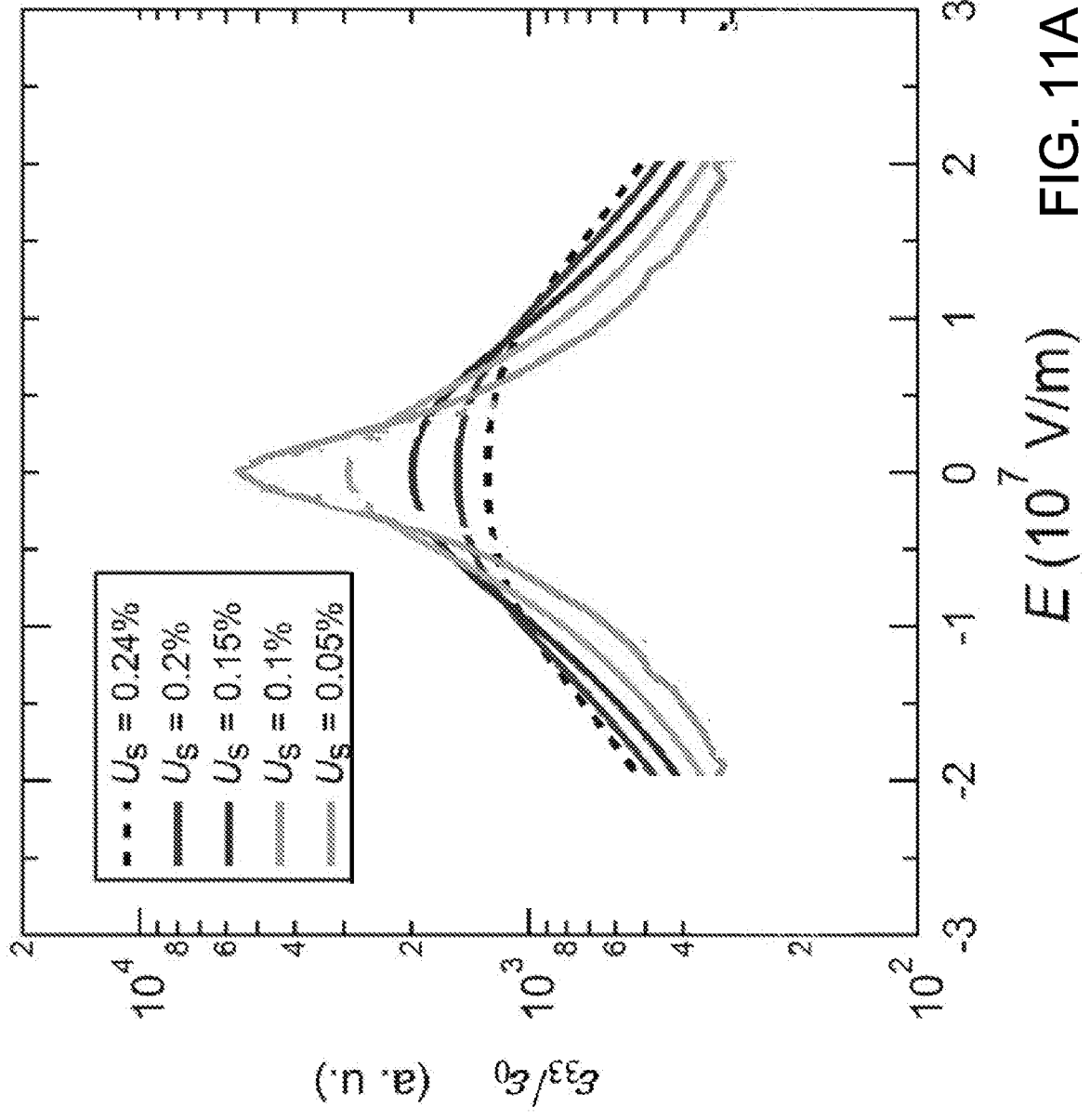
FIG. 11A illustrates the calculated tuning (quasi-static, i.e., at low frequency) of the plane-normal relative dielectric permittivity ($\varepsilon_{33}/\varepsilon_0$)

In FIG. 11A, the calculated tuning (quasi-static, i.e., at low frequency) of the plane-normal relative dielectric permittivity ($\varepsilon_{33}/\varepsilon_0$) is shown, consistent with the theoretically-predicted substantial enhancement also results in a very large plane-normal dielectric tunability. A tunability ratio of approximately 16:1 at 200 kV/cm for this strain state approximately corresponding to $BST_{0.8}/SSO$, and progressively and considerably lower for larger in-plane misfit strains, e.g., <4:1 at 200 kV/cm for 0.24% is seen, corresponding to typically predicted and observed plane-normal tunabilities for BST.

Figure 11B:
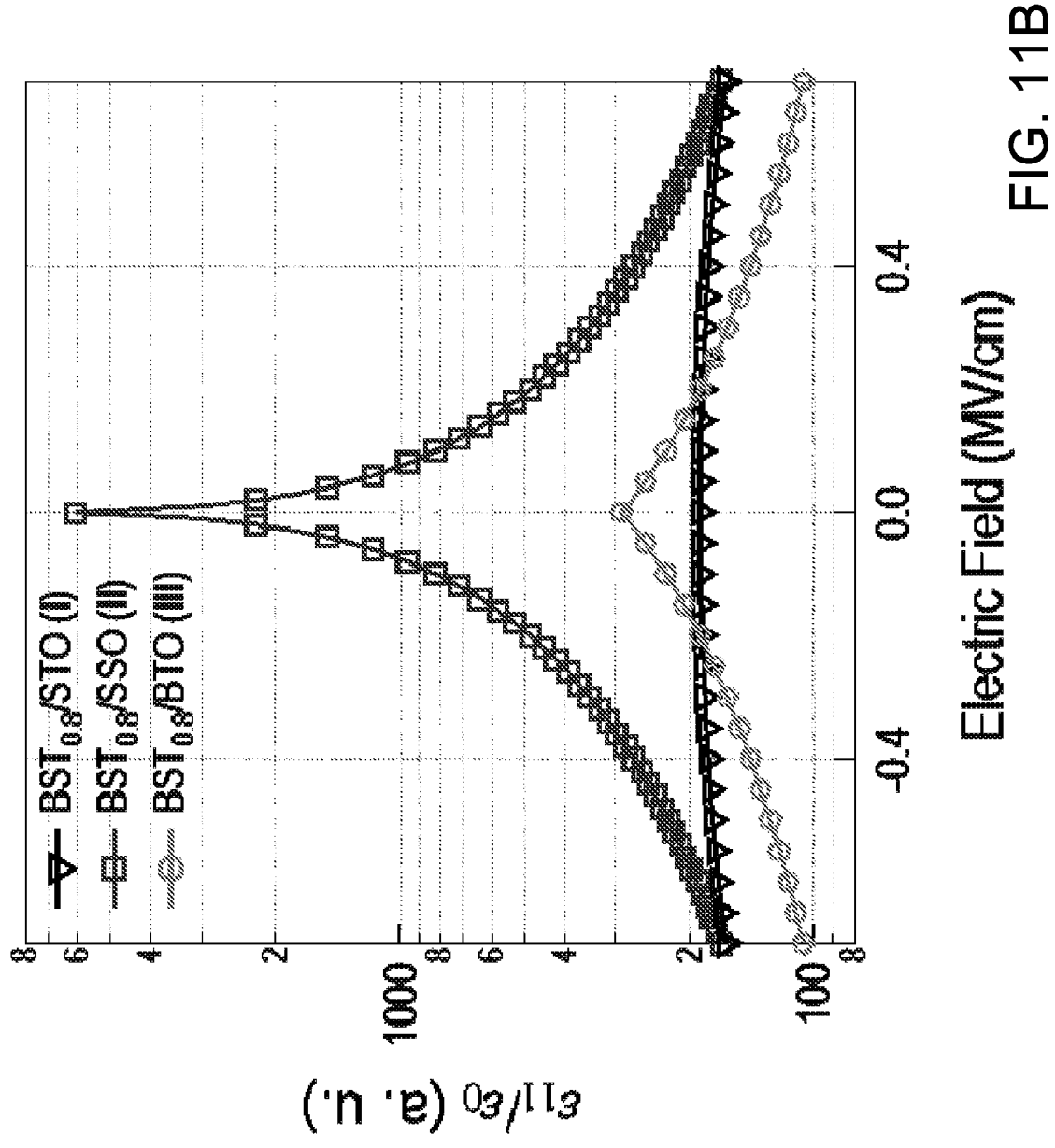
FIG. 11B shows the theoretically predicted in-plane ($\varepsilon_{11}/\varepsilon_0$) tunability ratios (<1.5:1 for 200 kV/cm, <3:1 for the full range shown) for BST films (e.g., for $BST_{0.8}$/STO(I) and $BST_{0.8}$/BTO(III)).

Shown in FIG. 11B is the theoretically predicted in-plane ($\varepsilon_{11}/\varepsilon_0$) tunability ratios (<1.5:1 for 200 kV/cm, <3:1 for the full range shown) are typical for BST films for most cases (e.g., for $BST_{0.8}/STO(I)$ and $BST_{0.8}/BTO(III)$). By contrast, those for which the novel composition of matter is specified (boundary region in proximity to a manifold of domain wall variant or superdomain phases), e.g., $BST_{0.8}/SSO$ (FIG. 11A), the theoretically predicted in-plane tunability values reaches more than 13:1 for 200 kV/cm, and >30:1 for the full range shown (0.67 MV/cm).

Figure 12:
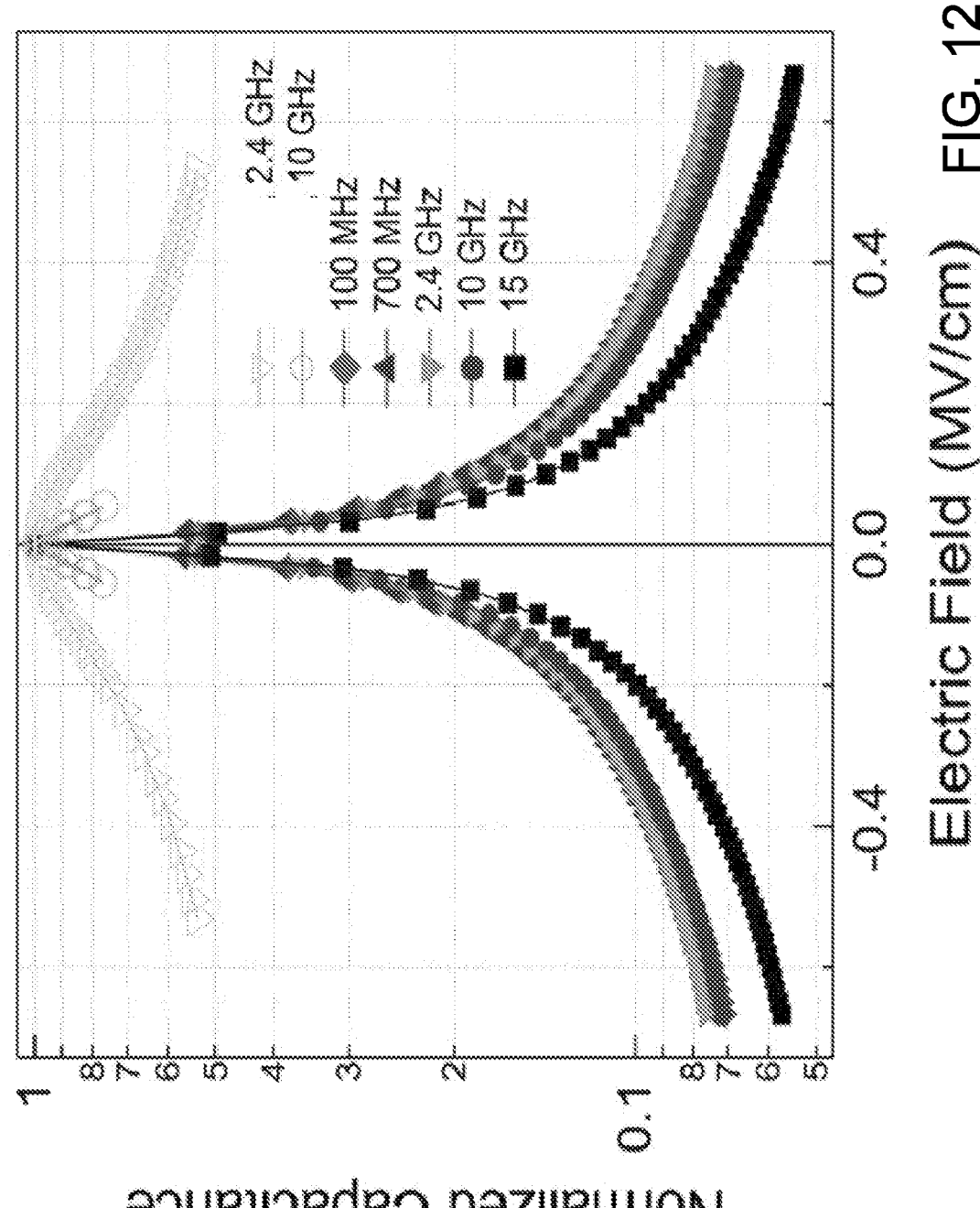
FIG. 12 illustrates measured voltage-capacitance dielectric tunability in representative example domain wall variant and superdomain strain-engineered meta-dielectric MIM capacitor films, with $BST_{0.8}$ compositions, SSO substrate, and frequencies denoted in the legends. Measured tunabilities of approximately 16:1 are higher than the state-of-the-art. The reproducibility in each film composition/substrate is verified by at least 3 different pads on each sample.

Shown in FIG. 12 is the measured electric field dependence of the measured in-plane-capacitance (normalized to the zero-field value) for a ≈400 nm-thick $BST_{0.8}/SSO$ film-substrate combination at selected frequencies measured using an interdigitated capacitor (IDC) electrode geometry corresponding to calculation result denoted by trace II in FIG. 11B. The tunability values (either in-plane or plane-normal), defined by the maximum-to-minimum permittivity ratio, are typical for BST films for most cases except those for which the novel composition of matter (boundary of superdomain phases) is specified, e.g., $BST_{0.8}/SSO$, which yield in-plane and plane-normal capacitance tunability ratios (for the range of voltages shown) of approximately 13:1 and higher (FIG. 12, traces denoted by solid marks), and as high as 19:1 (FIGS. 13 & 14), respectively. For comparison, this in-plane tunability ratio is considerably higher than the state-of-the-reported in single-crystal molecular beam epitaxial grown BST and Ruddelson-Popper phase film materials, which are denoted by the open pink inverted triangles and open blue circles at corresponding frequencies.

Figure 13A:
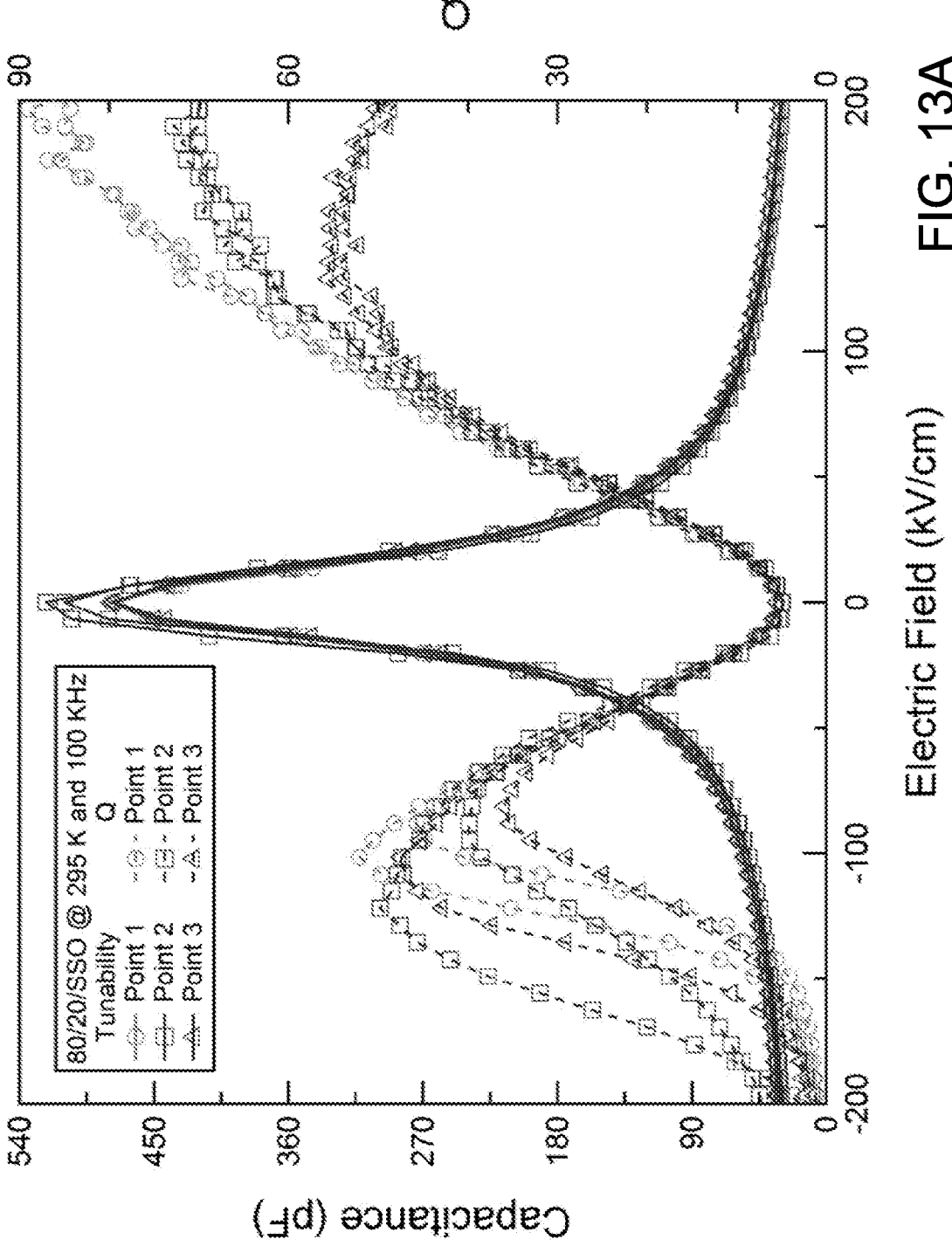
FIGS. 13A-13C illustrates measured voltage-capacitance dielectric tunability in representative example domain wall variant and superdomain strain-engineered meta-dielectric MIM capacitor films including quality factor, in $BST_{0.8}$ composition and SSO substrate, at frequencies 10 kHz (A) and 100 kHz (B). Measured tunabilities are greater than 16:1, higher than the state-of-the-art. Shown in C is the same material, 300 nm thick in an interdigitated capacitor (IDC) configuration, where a film is grown on a substrate without a bottom electrode but with top metal interdigitated finger electrodes, at 100 kHz. The data is plotted over the same field range (to the limit of voltage range for experimental setup), evidence that magnitude of tuning in the IDC is at least comparable to that for the MIM.
Figure 13B:
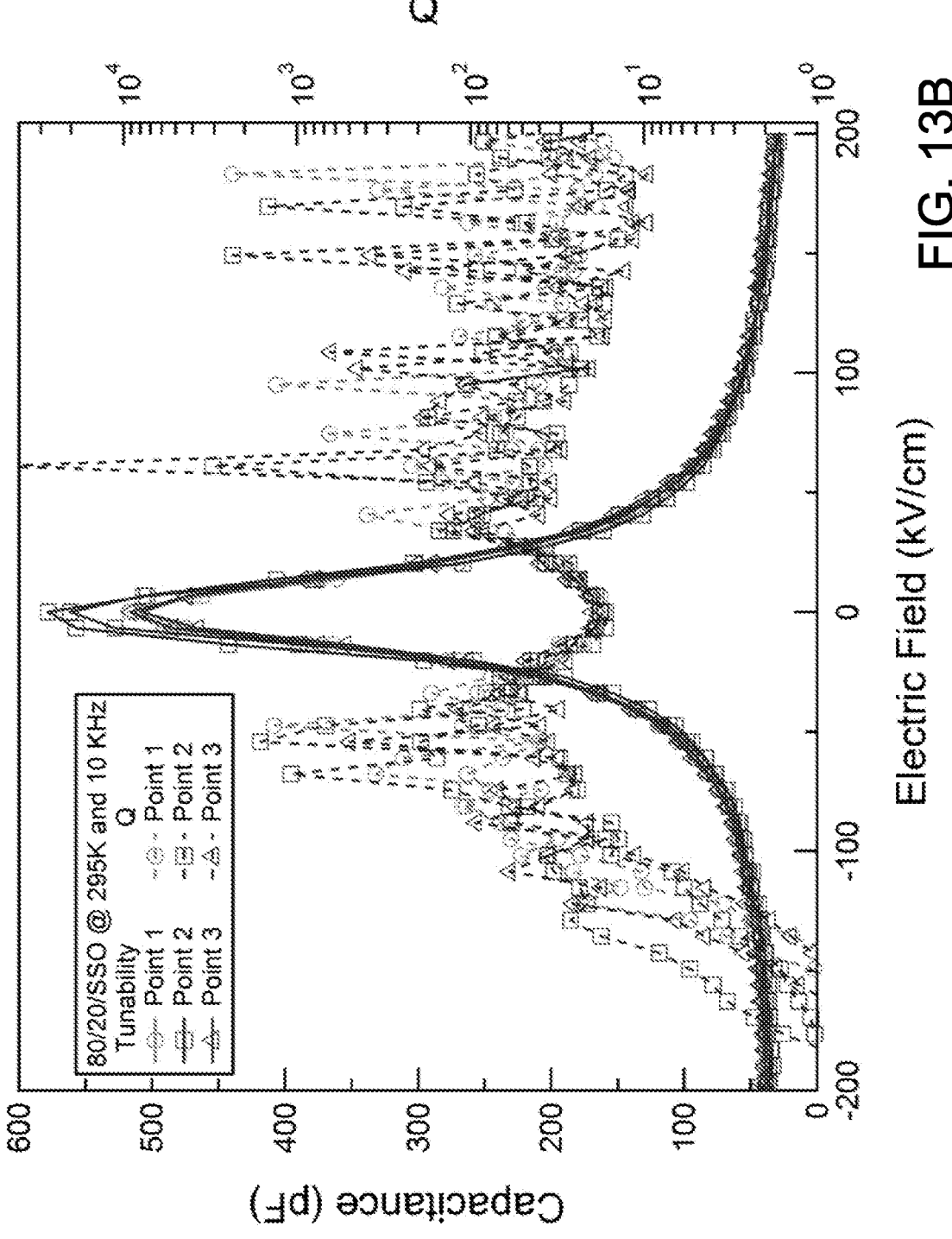

The tunability and loss may be measured in a MIM and IDC devices in the range of 10 kHz-1 MHz using co-planar electrodes and a semiconductor parameter analyzer (Keithley SCS4200). As seen in the panels of FIGS. 13A-13B, experimental results obtained at room temperature on thin-film (100-130 nm thick) MIM capacitors show capacitance tuning, e.g., from 578 pF (at zero bias) to 37.7 pF (at 2.5 V), results which are reproducible on different electrodes and on different films yield values as high as n≈18, at room temperature. Evidence for this extraordinarily high field tunability is also observed in the IDC device with the same material (FIG. 14A, inset). This is a factor of at least 3 to 12 times higher than any previously reported experimental result for a tunable dielectric capacitor (MIM or IDC) at room temperature for this magnitude of field.

Figure 13C:
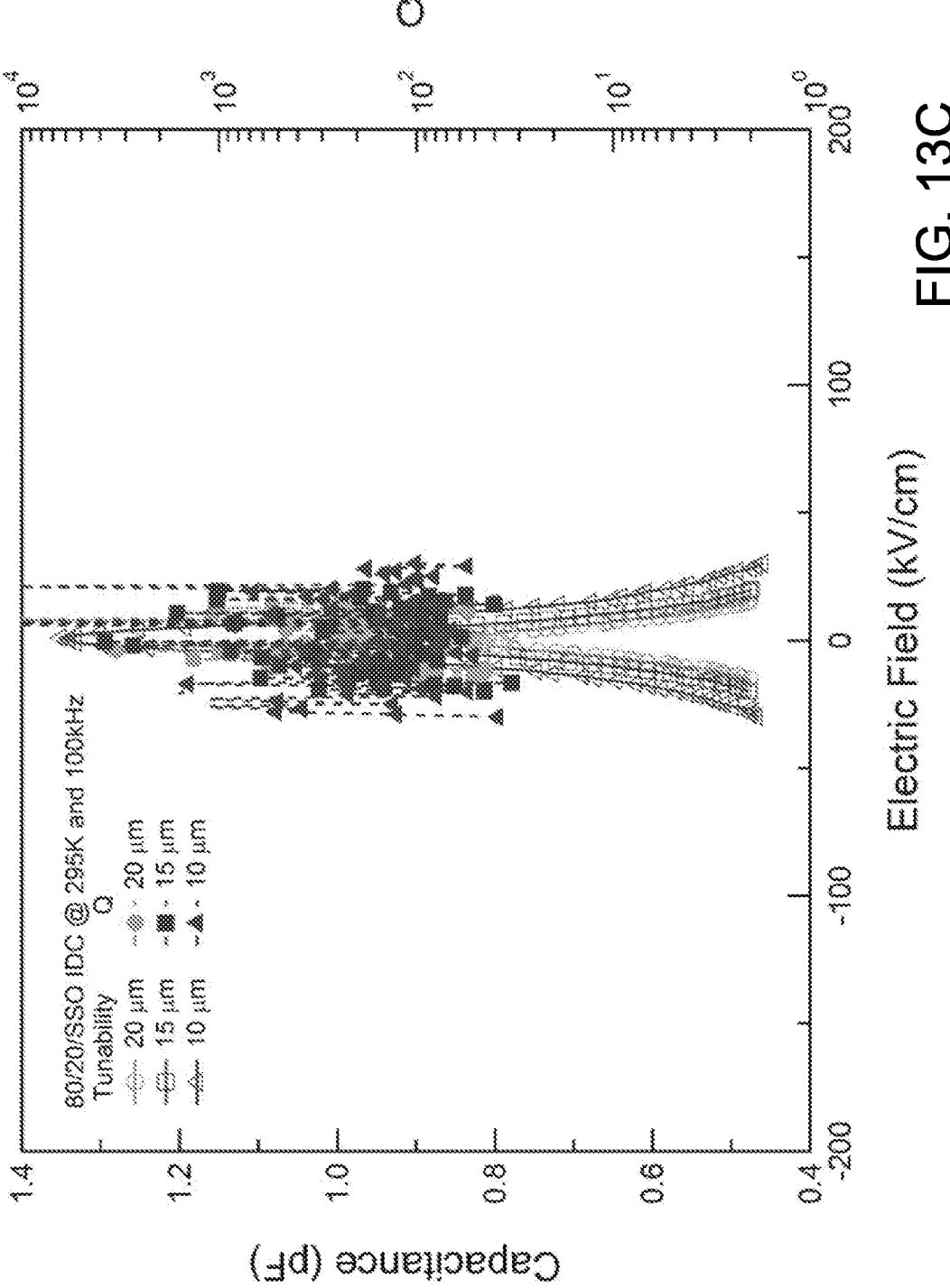

FIGS. 13A-13C illustrate measured voltage-capacitance dielectric tunability in representative example domain wall variant/superdomain strain-engineered meta-dielectric MIM capacitor films, with a $BST_{0.8}$ composition, SSO substrate and frequencies 10 kHz (A) and 100 kHz (B). Measured tunabilities are greater than 16:1, higher than the state-of-the-art. Shown in FIG. 13C is the same material, 300 nm thick in an IDC configuration at 100 kHz. The data are plotted over the same field range (to the limit of voltage range for experimental setup), evidence that magnitude of tuning in the IDC is at least comparable to that for the MIM.

Quality Factor Q

The quality factor Q, defined as the reciprocal of the loss tangent (tan δ), is another key FOM, since low values result in large insertion or propagation losses and poor device performance and signal fidelity. The current state-of-the-art zero-field value of Q for BST for a comparable value of x and in the low-frequency range (for which there is not much frequency dependence and for which electrode losses are not expected to be significant and therefore allow for assessment of dielectric material Q) is in the range of approximately 20-30 [see single crystal data reproduced here in FIG. 15 below, Bethe et al, as cited in *Appl. Phys. Lett.* 101, 252906 (2012); doi: 10.1063/1.4773034]. IDC data for devices, which more accurately reflect material Q, are plotted in FIG. 13C. Though there is significant scatter, the data do not show clear bias dependence of Q over the relatively small experimentally accessible field range. In this IDC geometry, devices on an identical film with different contact spacings of 10, 15 and 20 μm show values of Q that range from 147-164 over this frequency range, a factor of seven higher than the state-of-the-art for this composition range, for which only single crystal data is available.

The state of the art in Q in voltage-tuned BST at 0.5 GHz is Q≈205 at zero bias, decreasing to Q≈70 at 80 V (533 kV/cm), a device which shows a tunability of approximately 2:1 [Reproduced from *Applied Physics Letters* 109, 112902 (2016); doi: 10.1063/1.4961626]. Data collected on the present devices, including reference substrate de-embedding analysis, shows a zero-bias value of Q≈40 at 0.5 GHz for zero bias, rising to Q≈50 at an applied field of 30 kV/cm. These values are surprisingly high for materials and processing that have not yet been optimized, and improvements should be attainable. An important difference in a device compared with the cited state-of-the-art devices is that in one or more devices Q is seen to increase with bias field, though the range of tuning was limited in these initial experiments.

Commutation Quality Factor.

The more technologically relevant FOMs involve combinations of n and Q. For example, the commutation quality factor (CQF), which is defined as:

$$CQF = \frac{(n-1)^2}{n \tan\delta_1 \tan\delta_2}$$

$CQF = (n-1)^2/(n \tan \delta_1 \tan \delta_2)$ is a commonly accepted FOM, or the CQF as a function of electric field:

$$CQF(E) = \frac{(n(E)-1)^2}{n(E)} Q(E)Q(0)$$

Low-frequency Range CQF. The highest CQF(E) in the low-frequency range was reported in *Applied Physics Letters* 109, 112902 (2016); doi: 10.1063/1.4961626, for x=0.19, CQF(E)=1×10⁶. Taking measured n and Q values obtained in the MIM configuration where electrode losses are expected to dominate dielectric material losses, observed values ($\approx 10^4$ at very small field and rising) are comparable to most literature ($10^1$-$10^4$) [*J. Mater. Sci.* 44, 5288 (2009)]. If one considers the material Q, in the lower frequency range, e.g., at 10 kHz, one may observe zero-bias Q$\approx$154-158 in BST$_{0.8}$/SSO IDC devices. Combining this with measured tunability in the MIM-configured material of n$\approx$15, this yields a CQF$\approx$3$\times$10$^5$, which is comparable to the state-of-the-art in this frequency range as reported in *Applied Physics Letters* 109, 112902 (2016); doi: 10.1063/1.4961626.

Figure 14:
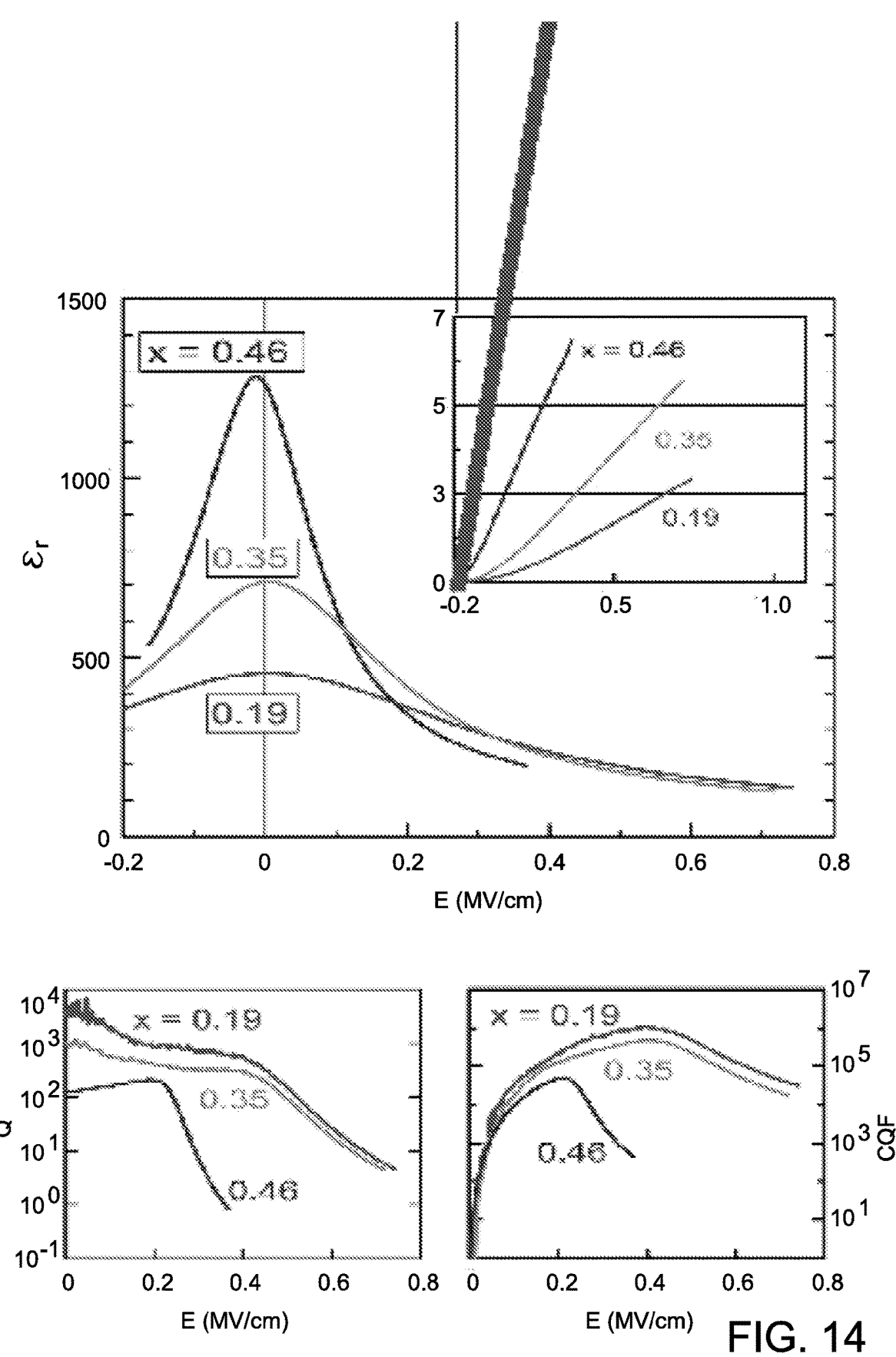
FIG. 14 illustrates state of the art voltage-tunable MIM-configured BST films, adapted from *Applied Physics Letters* 101, 252906 (2012); doi: 10.1063/1.4773034.

FIG. 14 illustrates state-of-the-art in voltage-tunable MIM-configured BST films. (a) Field dependent permittivity for samples with BST films with different Ba concentrations (x=0.19, 0.35, and 0.46). The inset shows the tunability as a function of field, n(E) (b,c) Field dependence of the quality factor Q (b), and of the Commutation Quality Factor (c). Data measured at 1 MHz. Data for superdomain-engineered films is represented in the inset by the purple trace (100 kHz), and Q for these films exceeds by an order of magnitude the data shown for the most similar stoichiometry. Adapted from Ref [*Appl. Phys. Lett.* 101, 252906 (2012); doi: 10.1063/1.4773034]

Figure 15:
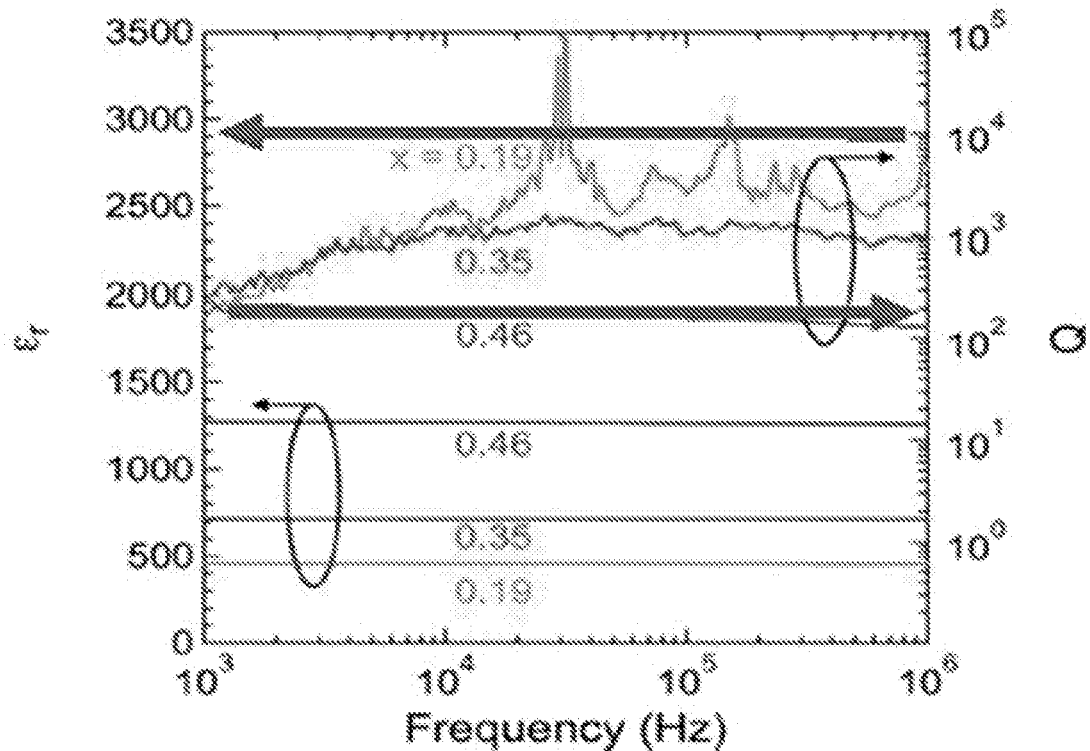
FIG. 15 (top) illustrates the state-of-the-art in the frequency dependence of relative permittivity and Q in a high-quality BST film, for selected compositions as shown in the figure. Values for Q at frequencies at low-frequency radio frequencies (at or below 1 MHz) are seen to range generally between $10^2$ and $10^4$, and relative dielectric permittivities below 1300. The bottom panel shows the Ba composition dependence of state-of-the-art Q in BST material, for molecular beam epitaxy (MBE) grown single crystal films, bulk ceramics, bulk single crystals (end members), and thin films produced by radio-frequency sputtering and pulsed laser deposition. The values of Q are seen to decrease with increasing composition x.
Figure 15:
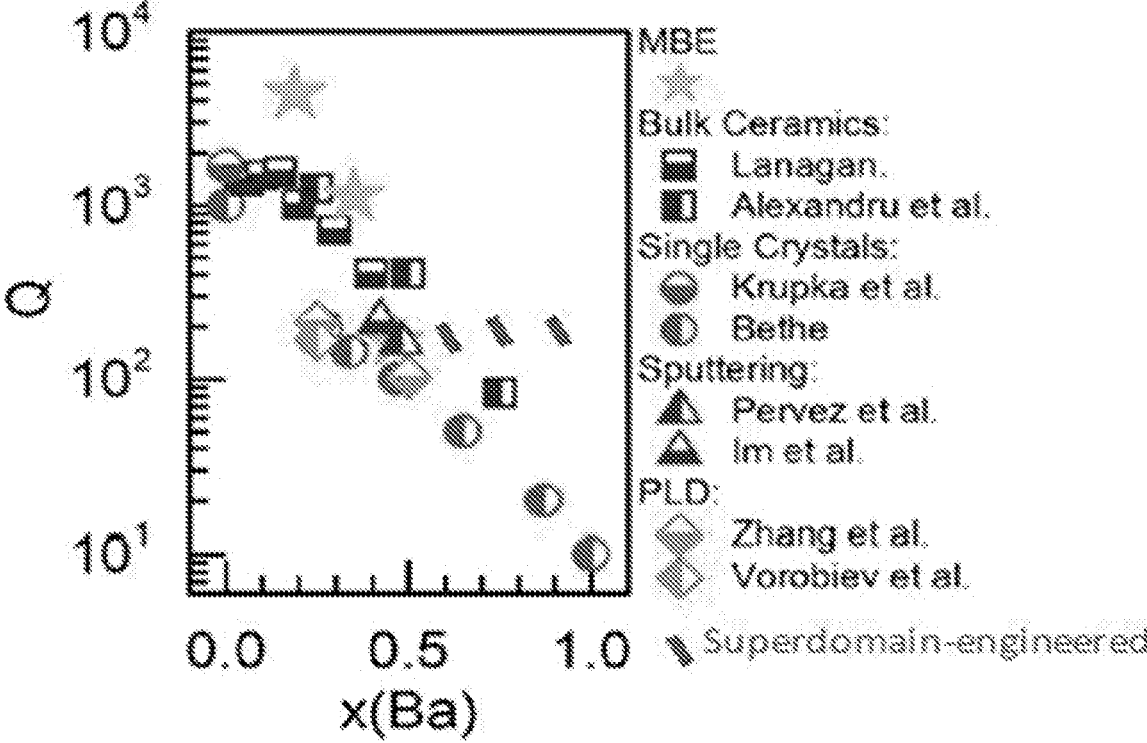

FIG. 15 illustrates a comparison with the current state-of-the-art. Top panel: $\varepsilon_{33}/\varepsilon_0$ (left axis) and Q (right axis), plotted as a function of frequency, for several different compositional values of BST$_x$, which refer to x. The bottom panel shows the current state-of-the-art in composition dependence of Q for different film methods, and different Ba compositions. The values of Q are seen to decrease with increasing composition x. The added marks denote the meta-dielectric film, showing the highest values of Q for these compositions, in material for which processing has not been optimized. Adapted from Ref [*Appl. Phys. Lett.* 101, 252906 (2012); doi: 10.1063/1.4773034].

Figure 16:
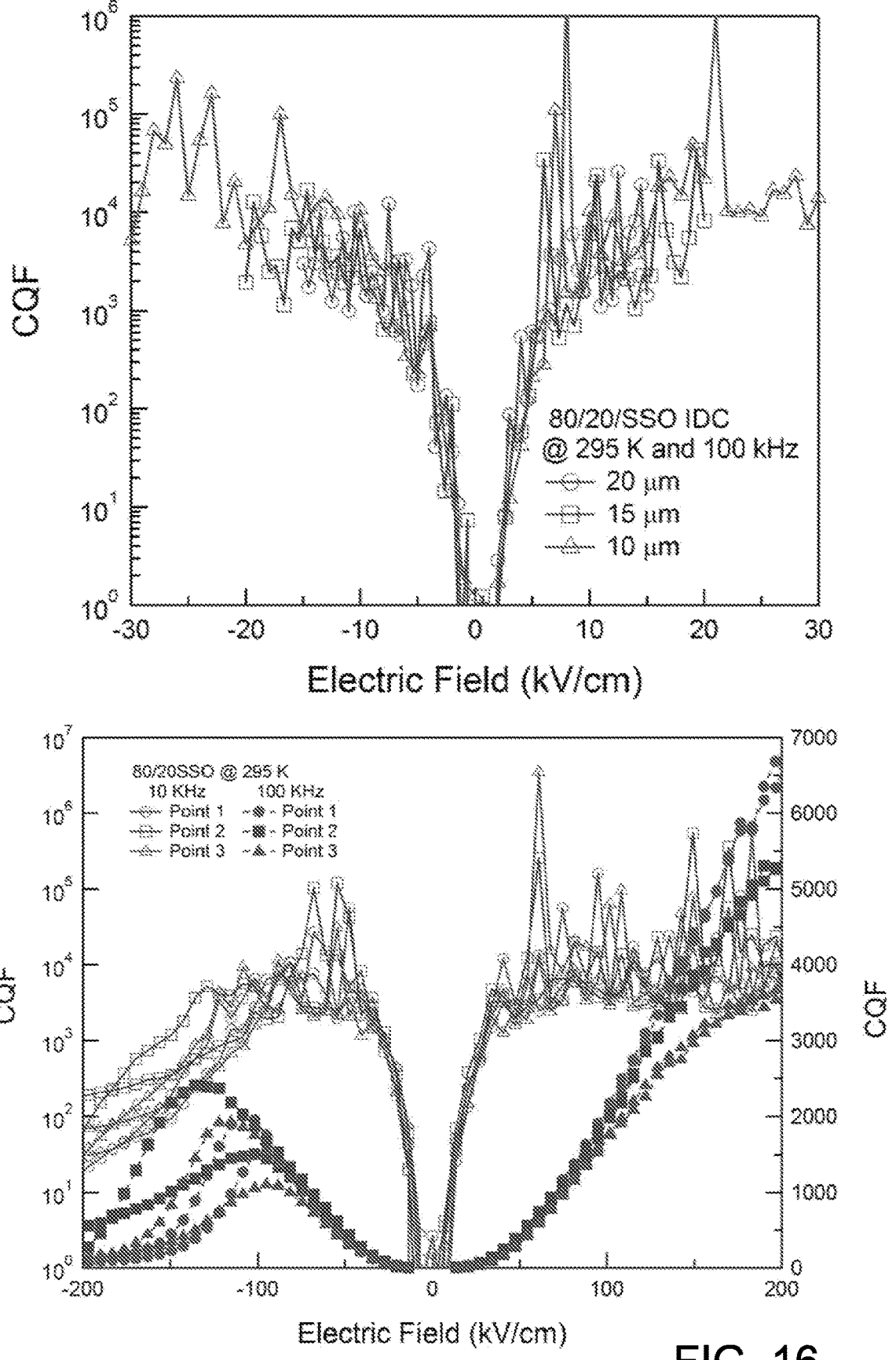
FIG. 16 shows measured field-dependent low-frequency Commutation Quality Factor (CQF) for (top) IDC at 100 kHz for three different electrode separations as denoted in the legend, and (bottom) in MIM-configured measured high domain wall dense domain wall variant-engineered devices for three different devices at 10 kHz and 100 kHz.

FIG. 16 illustrates a field-dependent Commutation Quality Factor (CQF) for (top) IDC and (bottom) MIM-configured measured domain wall-variant (superdomain)-engineered devices possessing different gap spacings and collected at 10 kHz and 100 kHz.

The present disclosure relates to at least the following aspects:

Aspect 1. A strained dielectric meta-material configured as a solid solution of a ferroelectric, the strained dielectric meta-material comprising at least one type of in-plane component-containing superdomain structure that is in phase-co-existence with, or in close phase proximity to, a paraelectric state achieved at zero electric field over a finite range of non-zero electric field. Close proximity may comprise +/-0.25% of the boundary in strain.

Aspect 2. The strained dielectric meta-material of aspect 1, wherein an end point of the finite range is a dielectric breakdown point of the strained dielectric meta-material.

Aspect 3. A strained dielectric meta-material configured as a solid solution of a ferroelectric, the strained dielectric meta-material comprising at least one type of in-plane superdomain structure that is in phase-co-existence with, or in close phase proximity to, a second phase state.

Aspect 4. The strained dielectric meta-material of any one of aspects 1-3, wherein the strained dielectric meta-material is configured as an end member of the ferroelectric.

Aspect 5. The strained dielectric meta-material of any one of aspects 1-4, wherein the ferroelectric is configured to exhibit displacive and/or order-disorder ferroelectric characteristics at a predetermined temperature and pressure.

Aspect 6. The strained dielectric meta-material of any one of aspects 1-5, wherein the strained dielectric meta-material comprises Ba$_x$Sr$_{1-x}$TiO$_3$ (BST$_x$).

Aspect 7. The strained dielectric meta-material of aspect 6, wherein x=0.8.

Aspect 8. The strained dielectric meta-material of aspect 6, wherein x is between 0.5 and 0.9.

Aspect 9. The strained dielectric meta-material of any one of aspects 1-8, wherein the strained dielectric meta-material comprises Ba$_x$Sr$_{1-x}$TiO$_3$ (BST$_x$) disposed on a substrate.

Aspect 10. The strained dielectric meta-material of aspect 9, wherein the substrate comprises SmScO$_3$, or other substrates of in-plane lattice parameters within 3%.

Aspect 11. The strained dielectric meta-material of any one of aspects 1-8, wherein the strained dielectric meta-material is disposed on a substrate.

Aspect 12. The strained dielectric meta-material of aspect 11, wherein the substrate exhibits at least one in-plane lattice parameter between, and including, 3.900 Angstroms to 4.010 Angstroms. The at least one in-plane lattice parameter may including intervening end points of the range such as 3.910, 3.920, 3.930, 3.940, 3.950, 3.960, 3.970, 3.980, 3.990, 4.000. Other intervening endpoints are contemplated herein.

Aspect 13. The strained dielectric meta-material of any one of aspects 1-12, wherein the strained dielectric meta-material comprises BaTiO$_3$ (BTO).

Aspect 14. The strained dielectric meta-material of any one of aspects 1-13, wherein the at least one type of in-plane component-containing superdomain structure is generated below the peak permittivity of the strained dielectric meta-material.

Aspect 15. The strained dielectric meta-material of any one of aspects 1-14, wherein a domain width of the at least one type of in-plane component-containing superdomain structure is between 5 nm and 1000 nm.

Aspect 16. The strained dielectric meta-material of any one of aspects 1-15, wherein the strained dielectric meta-material exhibits a stable or meta-stable engineered in-plane strain state (U$_s$) between -2.0% and 2.0% over a temperature range of between 0 K and 800 K. Other intervening endpoints are contemplated.

Aspect 17. The strained dielectric meta-material of any one of aspects 1-16, wherein the at least one type of in-plane component-containing superdomain structure comprises c/a/c/a.

Aspect 18. The strained dielectric meta-material of any one of aspects 1-16, wherein the at least one type of in-plane component-containing superdomain structure comprises ca*/aa*/ca*/aa*.

Aspect 19. The strained dielectric meta-material of any one of aspects 1-16, wherein the at least one type of in-plane component-containing superdomain structure comprises ca$_1$/ca$_2$/ca$_1$/ca$_2$.

Aspect 20. The strained dielectric meta-material of any one of aspects 1-16, wherein the at least one type of in-plane component-containing superdomain structure comprises a$_1$/a$_2$/a$_1$/a$_2$.

Aspect 21. The strained dielectric meta-material of any one of aspects 1-16, wherein the at least one type of in-plane component-containing superdomain structure comprises aa$_1$/aa$_2$/aa$_1$/aa$_2$.

Aspect 22. The strained dielectric meta-material of any one of aspects 1-16, wherein the at least one type of in-plane component-containing superdomain structure comprises r$_1$/r$_2$/r$_1$/r$_2$.

Aspect 23. The strained dielectric meta-material of any one of aspects 1-16, wherein the at least one type of in-plane component-containing superdomain structure comprises a plurality of domain structures comprising c/a/c/a, ca*/aa*/ ca\*/aa\*, $ca_1/ca_2/ca_1/ca_2$, $a_1/a_2/a_1/a_2$, $aa_1/aa_2/aa_1/aa_2$, or $r_1/r_2/r_1/r_2$ or a combination thereof.

Aspect 24. The strained dielectric meta-material of any one of aspects 1-23, wherein strained dielectric meta-material comprises a material that has electric dipolar degrees of freedom.

Aspect 25. The strained dielectric meta-material of any one of aspects 1-24, wherein at least a portion of the strained dielectric meta-material is grown as a film under coherent or partially relaxed tensile (compressive) strain.

Aspect 26. The strained dielectric meta-material of aspect 25, wherein growth of the film under coherent or partially relaxed tensile (compressive) strain facilitates location of an intersection of domains at a predetermined temperature.

Aspect 27. The strained dielectric meta-material of aspect 25, wherein growth of the film is implemented by physical vapor deposition, RF or DC sputtering, pulsed laser deposition, molecular beam epitaxy, metalorganic chemical vapor deposition, atomic layer deposition, or a combination thereof.

Aspect 28. The strained dielectric meta-material of any one of aspects 1-27, wherein the strained dielectric meta-material exhibits an anomaly in the thermodynamic susceptibility.

Aspect 29. The strained dielectric meta-material of aspect 28, wherein the anomaly is a rise or peak.

Aspect 30. The strained dielectric meta-material of aspect 28, wherein the thermodynamic susceptibility comprises pyroelectric, piezeoelectric, or a combination of both.

Aspect 31. An article comprising the strained dielectric meta-material of any one of aspects 1-30.

Aspect 32. The article of aspect 31 comprising a radio-frequency tunable filter, a tunable antenna, tunable phase shifter, (tunable) detector, sensor, actuator or transducer, or impedance matching circuit element.

In summary, novel domain wall variant/superdomain-engineered materials defined by proximity to a domain wall variant and superdomain phase boundary or vertex phase coexistence possessing in-plane and plane-normal domains enable breakthrough figures of merit in dielectric permittivity, capacitance and their voltage tunability, in excellent agreement with model predictions. Commutation Quality Factors are shown to be extremely high. The example of $aa_1/aa_2$ domains are designed and realized in a series BST films by tuning strain with different substrates and much higher plane-normal dielectric constants are observed compared with their counterpart owning plane-normal polarizations. The phase instability inherently activates domain evolution and domain wall pinning at low T, leading to a secondary contribution to $\varepsilon_{33}$ and similarly to $\varepsilon_{11}$. Through a combination of phenomenological LGD model, thin film epitaxy and T-dependent PFM, a route toward achieving high-κ films by strain and temperature is demonstrated and similar results are expected in other ferroelectric chemistries and compositions, and in related ferroic and functional properties that can be described with an analogous formalism and prescription, and realized experimentally.

Figure 17A:
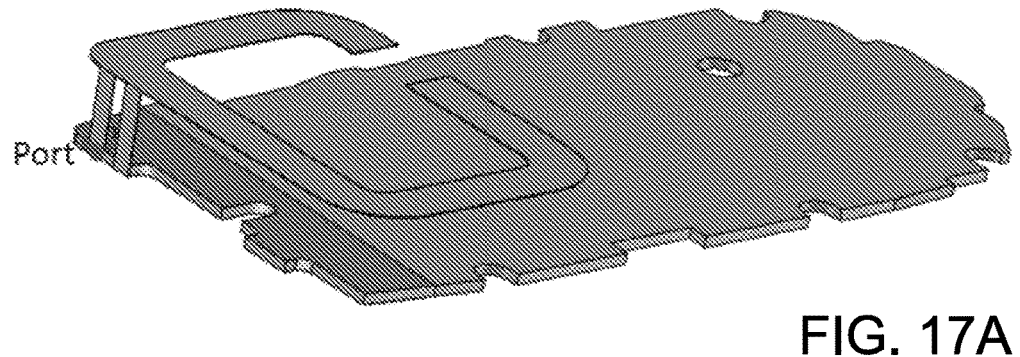
FIG. 17A shows an example antenna.
Figure 17B:
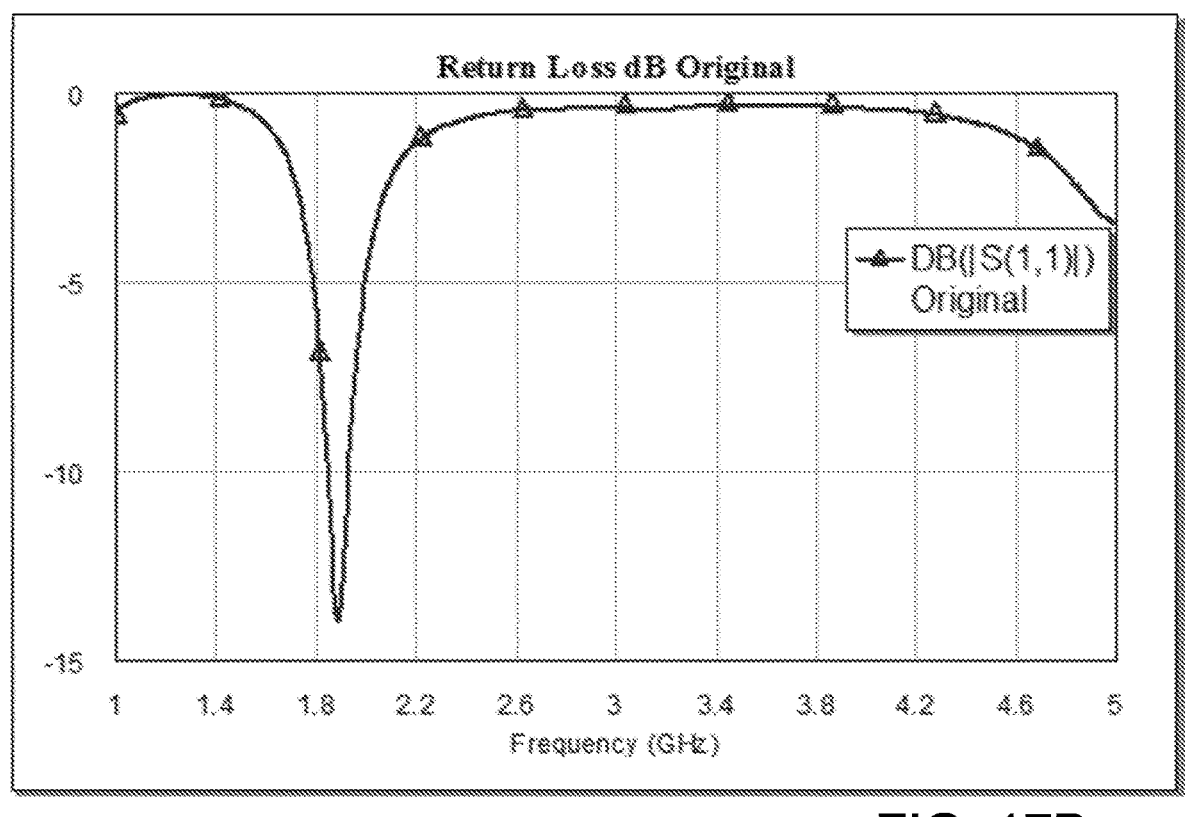
FIG. 17B shows a plot of return loss over frequency.
Figure 17C:
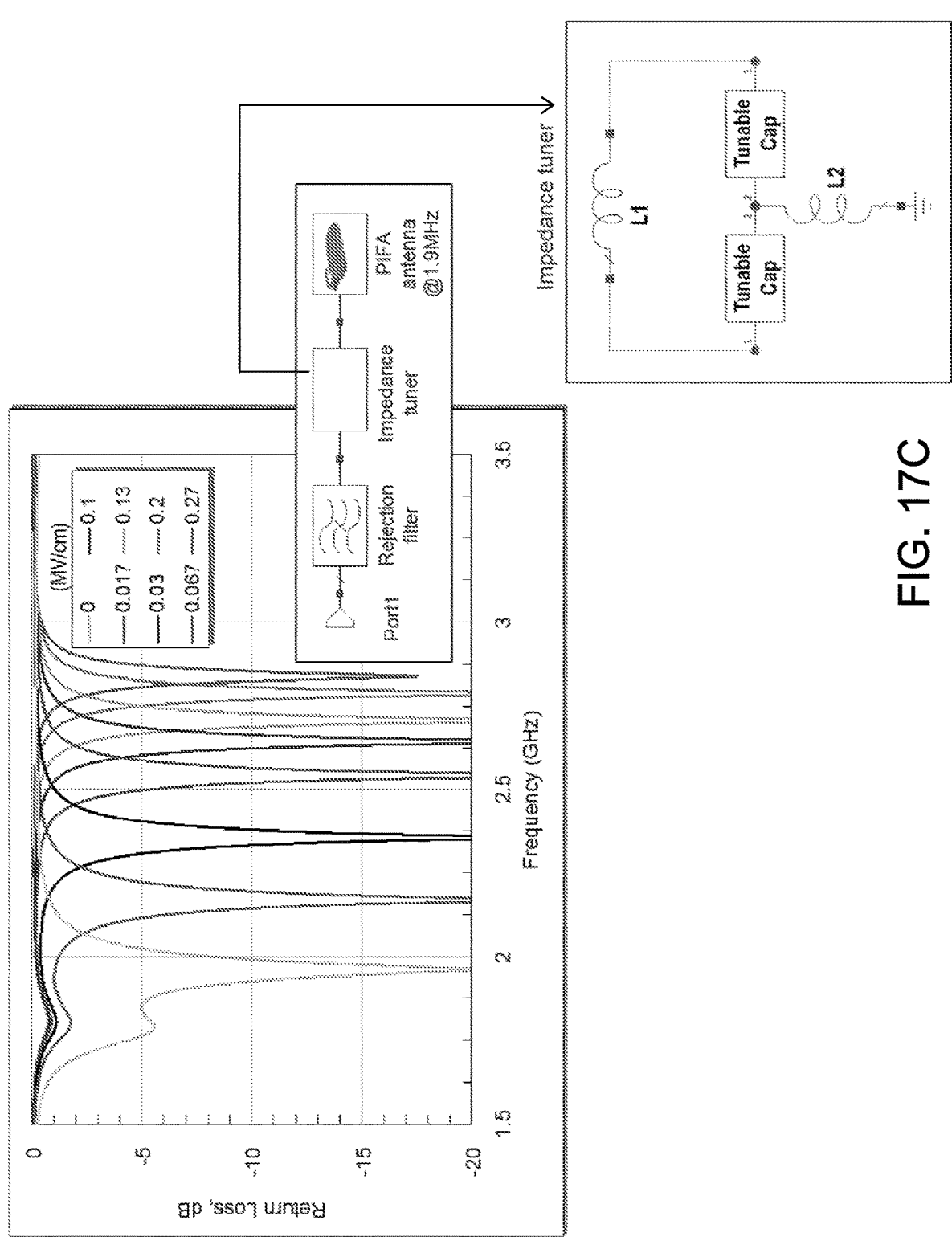
FIG. 17C shows a tunable circuit and a plot of return loss over frequency illustrating tunability of frequency response.

Example applications may include an antenna tuner. AS shown in FIGS. 17A-17C, a Planar Inverted F Antenna (PIFA)-type antenna over a generic chassis is simulated through a three-dimensional (3D) Electromagnetic (EM) Computer-Aided Design (CAD). The antenna is designed to work at 1.9 GHz. The novel material-based varactors can be used to design an antenna tuner that can translate the matching frequency in order to be able to use the antenna in other frequency ranges. This is particularly useful when dealing with environmental mismatch. This particular example shows an antenna tuner designed as a single stage phase shifter, providing approximately 1 GHz of tuning ability, as shown in the Return Loss graph. The varactors are characterized through measurements of their scattering parameters. This measurement is carried out with a vector network analyzer. Other configurations and tuning may be used.

Figure 18:
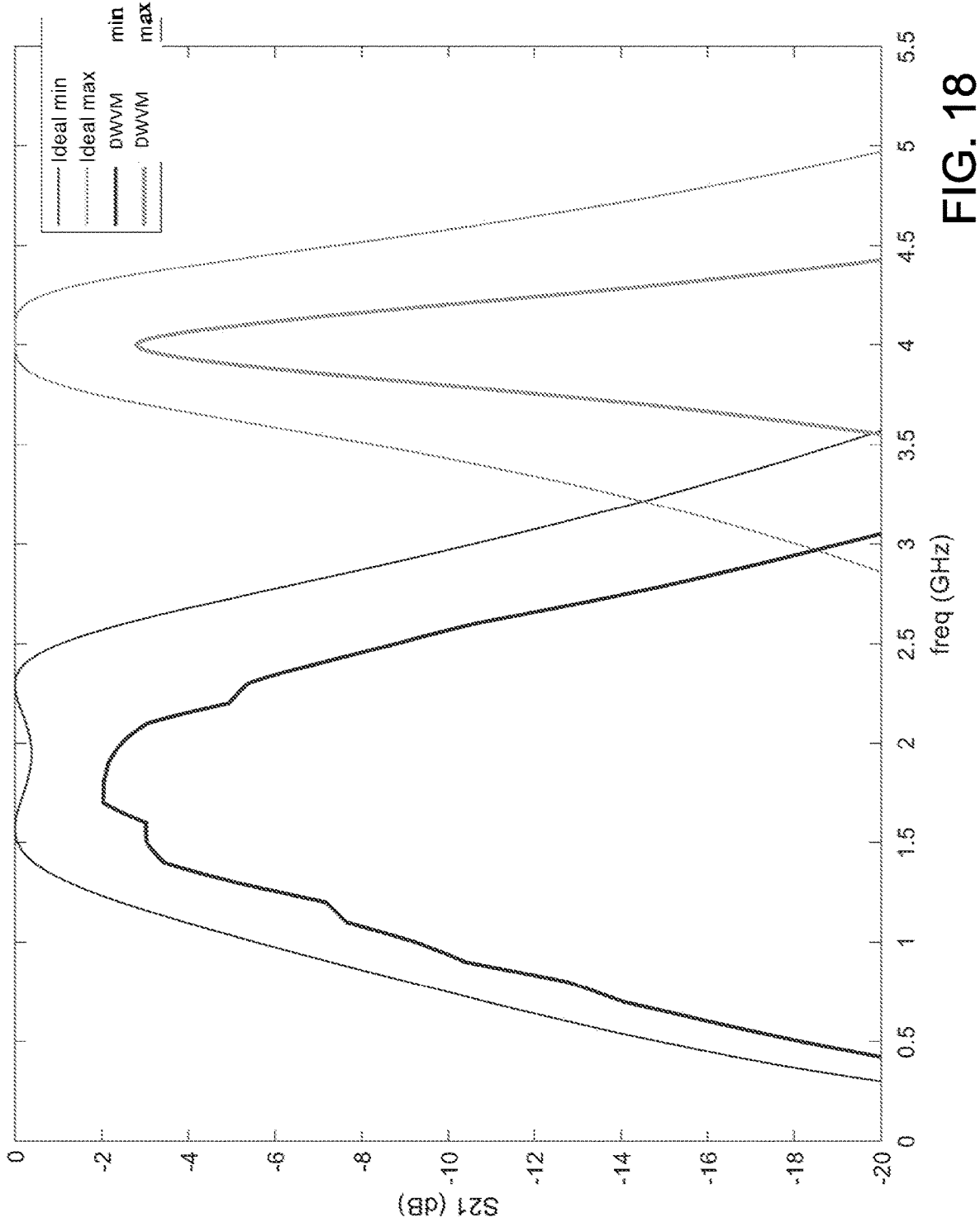
FIG. 18 shows an example plot of insertion loss over frequency.
Figures 19A, 19B:
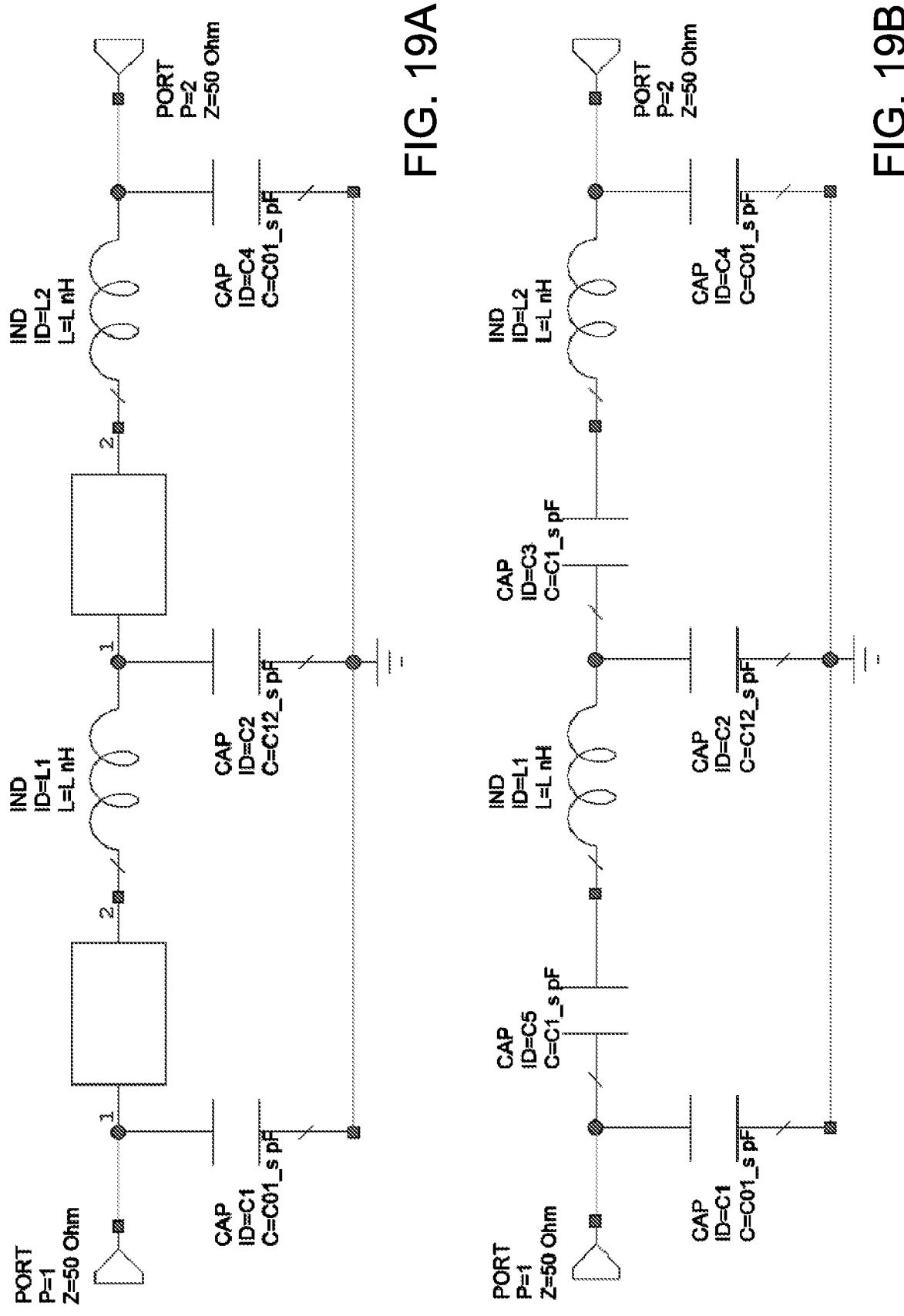
FIG. 19A shows an example Circuit based on domain wall variant material (DWVM).
FIG. 19B shows an example circuit.

Example applications may include filter configuration. As shown in FIGS. 18-19, a second-order C-coupled Butterworth band pass filter may be configured where the tunable elements are capacitors placed on the series-type branch. This branch of the filter regulates the center frequency of the band pass response. The parallel branches could also include tunable elements, and these would regulate the bandwidth of the band pass. This example shows, using circuit simulations, the spectral agility of varactors utilizing the new material in covering approximately 2.5 GHz frequency band, with insertion loss (IL) varying between approximately 2 and 2.8 dB. The varactors are characterized through measurements of their scattering (S matrix) parameters. This measurement is carried out with a vector network analyzer.

Although the meta-materials and articles have been described herein with reference to preferred embodiments and/or preferred methods, it should be understood that the words which have been used herein are words of description and illustration, rather than words of limitation, and that the scope of the instant disclosure is not intended to be limited to those particulars, but rather is meant to extend to all structures, methods, and/or uses of the herein described meta-materials. Those skilled in the relevant art, having the benefit of the teachings of this specification, may effect numerous modifications to the meta-materials as described herein, and changes may be made without departing from the scope and spirit of the instant disclosure, for instance as recited in the appended claims.

APPENDIX

Figure 20:
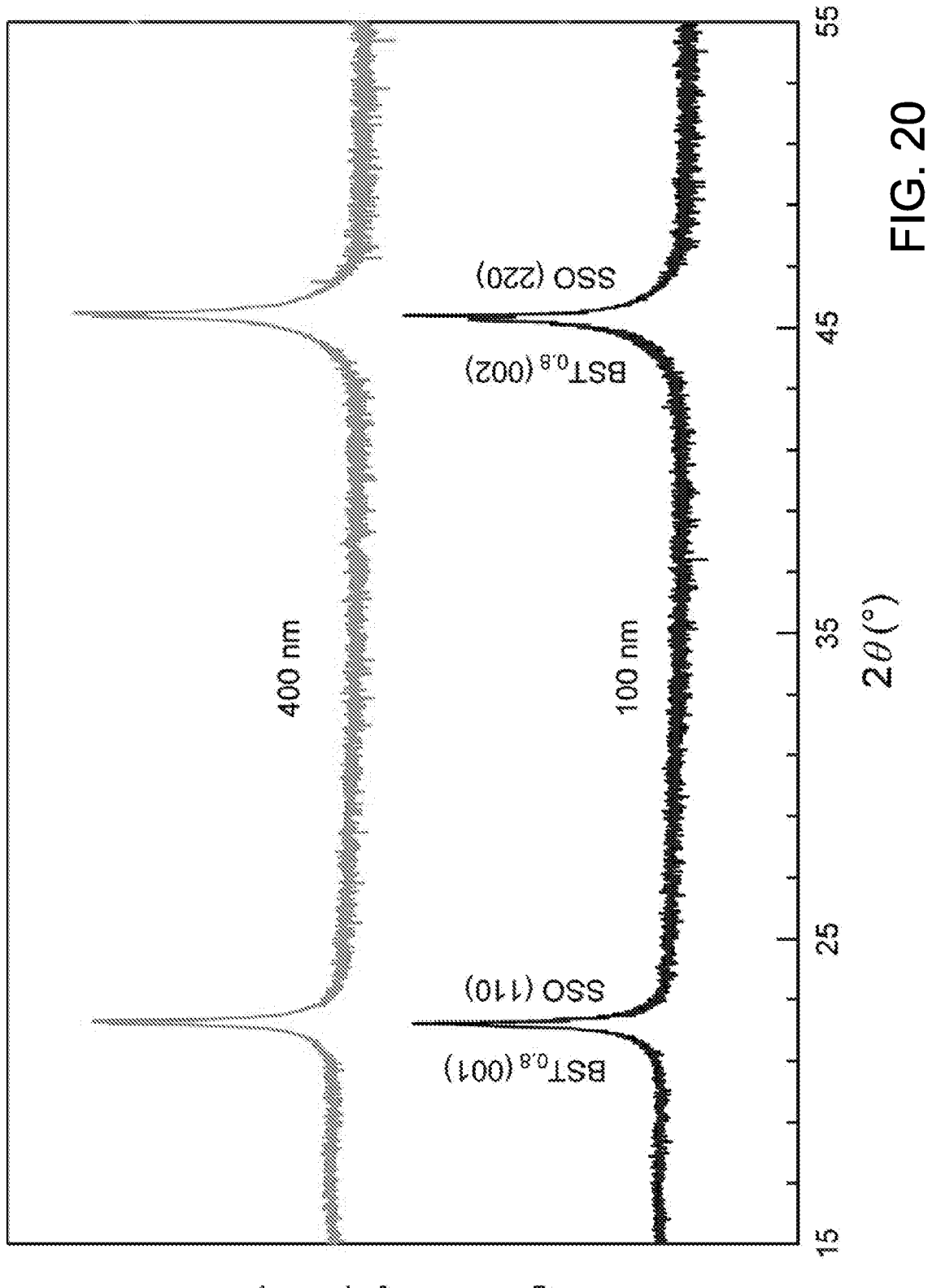
FIG. 20 shows X-ray diffraction data of the films (log scale, offset for clarity).

A1. X-ray diffraction data of films (log scale, offset for clarity) shown in FIG. 20.

Figure 21:
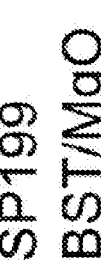
FIG. 21 shows an example Rutherford backscattering spectroscopy analysis.
Figure 21:

A2. Rutherford backscattering spectroscopy analysis is shown in FIG. 21.

A3. Landau-Ginzburg-Devonshire model enabling calculation of BST phase diagram and $\varepsilon_{33}$ derivation
The Helmholtz energy density of BST thin film is $$
\begin{aligned}
F_{BST} = {}& a_{1,BST}^{\sigma}(P_1^2 + P_2^2 + P_3^2) + a_{11,BST}^{\sigma}(P_1^4 + P_2^4 + P_3^4) + \\
& a_{12,BST}^{\sigma}(P_1^2 P_2^2 + P_1^2 P_3^2 + P_2^2 P_3^2) + a_{111,BST}^{\sigma}(P_1^6 + P_2^6 + P_3^6) + \\
& a_{112,BST}^{\sigma}[P_1^4(P_2^2 + P_3^2) + P_2^4(P_1^2 + P_3^2) + P_3^4(P_1^2 + P_2^2)] + \\
& a_{123,BST}^{\sigma} P_1^2 P_2^2 P_3^2 + a_{1111,BST}^{\sigma}(P_1^8 + P_2^8 + P_3^8) + \\
& a_{1112,BST}^{\sigma}[P_1^6(P_2^2 + P_3^2) + P_2^6(P_1^2 + P_3^2) + P_3^6(P_1^2 + P_2^2)] + \\
& a_{1122,BST}^{\sigma}(P_1^4 P_2^4 + P_1^4 P_3^4 + P_2^4 P_3^4) + \\
& a_{1123,BST}^{\sigma}(P_1^4 P_2^2 P_3^2 + P_1^2 P_2^4 P_3^2 + P_1^2 P_2^2 P_3^4) + k_0(u_1^2 + u_2^2 + u_3^2) + \\
& k_1(u_1 u_2 + u_1 u_3 + u_2 u_3) + k_2(u_1 P_1^2 + u_2 P_2^2 + u_3 P_3^2) + \\
& k_3[u_1(P_2^2 + P_3^2) + u_2(P_1^2 + P_3^2) + u_3(P_1^2 + P_2^2)] + k_6(u_1 + u_2 + u_3) + \\
& k_7(u_4^2 + u_5^2 + u_6^2) + k_8(u_4 P_2 P_3 + u_5 P_1 P_3 + u_6 P_1 P_2) + \\
& \left[ x \frac{3(\alpha_{BT} T + \Delta_{BT})^2}{2(s_{11,BT} + 2s_{12,BT})} + (1-x) \frac{3(\alpha_{ST} T + \Delta_{ST})^2}{2(s_{11,ST} + 2s_{12,ST})} \right]
\end{aligned}
$$

-continued

Where $a^{\sigma}_{1,BST} =$ $$x \cdot \left( a^{\sigma}_{1,BT} + \Delta_{BT} \frac{Q_{11,BT} + 2Q_{12,BT}}{s_{11,BT} + 2s_{12,BT}} + \alpha_{BT}T \frac{Q_{11,BT} + 2Q_{12,BT}}{s_{11,BT} + 2s_{12,BT}} \right) +$$

$$(1 - x) \cdot \left( a^{\sigma}_{1,ST} + \Delta_{ST} \frac{Q_{11,ST} + 2Q_{12,ST}}{s_{11,ST} + 2s_{12,ST}} + \alpha_{ST}T \frac{Q_{11,ST} + 2Q_{12,ST}}{s_{11,ST} + 2s_{12,ST}} \right)$$

$$a^{\sigma}_{11,BST} = x \cdot \left[ a^{\sigma}_{11,BT} + \frac{(Q^2_{11,BT} + 2Q^2_{12,BT})s_{11,BT} +}{2(s_{11,BT} - s_{12,BT})(s_{11,BT} + 2s_{12,BT})} \right] +$$

$$(1 - x) \cdot \left[ a^{\sigma}_{11,ST} + \frac{(Q^2_{11,ST} + 2Q^2_{12,ST})s_{11,ST} +}{2(s_{11,ST} - s_{12,ST})(s_{11,ST} + 2s_{12,ST})} \right]$$

$$a^{\sigma}_{12,BST} = x \cdot \left[ a^{\sigma}_{12,BT} + \frac{Q^2_{44,BT}}{2s_{44,BT}} + \frac{(Q^2_{12,BT} + 2Q_{11,BT}Q_{12,BT})s_{11,ST} - (Q^2_{11,BT} + 2Q^2_{12,ST})s_{12,BT}}{(s_{11,BT} - s_{12,BT})(s_{11,BT} + 2s_{12,BT})} \right] +$$

$$(1 - x) \cdot \left[ a^{\sigma}_{11,ST} + \frac{Q^2_{44,ST}}{2s_{44,ST}} + \frac{(Q^2_{12,ST} + 2Q_{11,ST}Q_{12,ST})s_{11,ST} - (Q^2_{11,ST} + 2Q^2_{12,ST})s_{12,ST}}{(s_{11,ST} - s_{12,ST})(s_{11,ST} + 2s_{12,ST})} \right]$$

$$a^{\sigma}_{111,BST} = x \cdot a^{\sigma}_{111,BT} + (1 - x) \cdot a^{\sigma}_{111,ST}$$

$$a^{\sigma}_{112,BST} = x \cdot a^{\sigma}_{112,BT} + (1 - x) \cdot a^{\sigma}_{112,ST}$$

$$a^{\sigma}_{123,BST} = x \cdot a^{\sigma}_{123,BT} + (1 - x) \cdot a^{\sigma}_{123,ST}$$

$$a^{\sigma}_{1111,BST} = x \cdot a^{\sigma}_{1111,BT} + (1 - x) \cdot a^{\sigma}_{1111,ST}$$

$$a^{\sigma}_{1112,BST} = x \cdot a^{\sigma}_{1112,BT} + (1 - x) \cdot a^{\sigma}_{1112,ST}$$

$$a^{\sigma}_{1122,BST} = x \cdot a^{\sigma}_{1122,BT} + (1 - x) \cdot a^{\sigma}_{1122,ST}$$

$$a^{\sigma}_{1123,BST} = x \cdot a^{\sigma}_{1123,BT} + (1 - x) \cdot a^{\sigma}_{1123,ST}$$

$$k_0 = x \cdot \frac{s_{11,BT} + s_{12,BT}}{2(s_{11,BT} - s_{12,BT})(s_{11,BT} + 2s_{12,BT})} +$$

$$(1 - x) \cdot \frac{s_{11,ST} + s_{12,ST}}{2(s_{11,ST} - s_{12,ST})(s_{11,ST} + 2s_{12,ST})}$$

$$k_1 = x \cdot \frac{-s_{12,BT}}{(s_{11,BT} - s_{12,BT})(s_{11,BT} + 2s_{12,BT})} + (1 - x) \cdot$$

$$\frac{-s_{12,ST}}{(s_{11,ST} - s_{12,ST})(s_{11,ST} + 2s_{12,ST})}$$

$$k_2 = x \cdot \frac{s_{12,BT} - Q_{11,BT}s_{11,BT}}{(s_{11,BT} - s_{12,BT})(s_{11,BT} + 2s_{12,BT})} + (1 - x) \cdot$$

$$\frac{(2Q_{12,ST} - Q_{11,ST})}{s_{12,ST}T - Q_{11,ST}s_{11,ST}} \frac{}{(s_{11,ST} - s_{12,ST})(s_{11,ST} + 2s_{12,ST})}$$

$$k_3 = x \cdot \frac{Q_{11,BT}s_{12,BT} - Q_{12,BT}s_{11,BT}}{(s_{11,BT} - s_{12,BT})(s_{11,BT} + 2s_{12,BT})} + (1 - x) \cdot$$

$$\frac{Q_{11,ST}s_{12,ST} - Q_{12,BT}s_{11,ST}}{(s_{11,ST} - s_{12,ST})(s_{11,ST} + 2s_{12,ST})}$$

$$k_6 = x \cdot \frac{-\Delta_{BT} - \alpha_{BT}T}{s_{11,BT} + 2s_{12,BT}} + (1 - x) \cdot \frac{-\Delta_{ST} - \alpha_{ST}T}{s_{11,ST} + 2s_{12,ST}}$$

$$k_7 = x \cdot \frac{1}{2s_{44,BT}} + (1 - x) \cdot \frac{1}{2s_{44,ST}}$$

-continued $$k_8 = x \cdot \frac{-Q_{44,BT}}{s_{44,BT}} + (1 - x) \cdot \frac{-Q_{44,ST}}{s_{44,ST}}$$

Calculation of the phase diagram and superdomain structures follows from application of Helmholtz energy minimization conditions in both single domain and polydomain cases using constant stress Landau coefficients, incorporating intrinsic and extrinsic contributions, and under the assumptions of clamped film boundary conditions, spatially homogeneous strain and polarization, and of a relatively thick film in which the depolarizing field can be neglected.

What is claimed is:

1. A strained dielectric material comprising at least one type of component containing a first domain wall variant type that is engineered in phase-co-existence with, or in close phase proximity to, i. a second phase state comprising at least a second component containing a second domain wall variant type or ii. a paraelectric state achieved at zero electric field, wherein the at least one type of component comprises one or more of an in-plane sub-domain polarization component or a plane-normal sub-domain polarization component, characterized in that, the at least one type of component is engineered such that the strained dielectric material exhibits an increased tunability ratio based at least on being engineered in phase-co-existence with, or in close phase proximity to, i. the second phase state or ii. the paraelectric state achieved at zero electric field or over a finite range of non-zero electric field.

2. A strained dielectric material comprising at least one type of component containing a first domain wall variant type that is in close phase proximity to a second phase state comprising at least a second component containing a second domain wall variant type, wherein the at least one type of component comprises one or more of an in-plane sub-domain polarization component or a plane-normal sub-domain polarization component.

3. The strained dielectric material of claim 2, wherein the strained dielectric material is configured as an end member of a solid solution of a ferroelectric.

4. The strained dielectric material of claim 2, wherein the strained dielectric material comprises perovskites, BaxSr1-xTiO3 (BSTx), PbTiO3, Pb(Zr,Ti)O3, (Pb,Sr)TiO3, BiFeO3, Bi(Fe,Mn)O3, or Ruddlesden-Popper phases An+1BnX3n+1, or Ruddlesden-Popper phases An+1A'2BnX3n+1 where A and A' represent alkali and/or alkaline earth metals, B═Ti, and X═O, or other ferroelectrics, or a combination thereof.

5. The strained dielectric material of claim 4, wherein x=0.8.

6. The strained dielectric material of claim 4, wherein x is between 0.01 and 0.9.

7. The strained dielectric material of claim 2, wherein the strained dielectric material is disposed on a substrate.

8. The strained dielectric material of claim 2, wherein the strained dielectric material comprises BaTiO3 (BTO) or SrTiO3 (STO), or a combination thereof.

9. The strained dielectric material of claim 2, wherein a domain width of the at least one type of component is between 5 nm and 1000 nm.

10. The strained dielectric material of claim 2, wherein the strained dielectric material exhibits a stable or meta-stable engineered in-plane strain state (Us) between-2.0% and 2.0% over a temperature range of between 1 mK and 800 K.

11. The strained dielectric material of claim 2, wherein at least one of the first or second domain wall variant type comprises c/a/c/a.

12. The strained dielectric material of claim 2, wherein at least one of the first or second domain wall variant type comprises ca*/aa*/ca*/aa*.

13. The strained dielectric material of claim 2, wherein at least one of the first or second domain wall variant type comprises ca1/ca2/ca1/ca2.

14. The strained dielectric material of claim 2, wherein at least one of the first or second domain wall variant type comprises a1/a2/a1/a2.

15. The strained dielectric material of claim 2, wherein at least one of the first or second domain wall variant type comprises aa1/aa2/aa1/aa2.

16. The strained dielectric material of claim 2, wherein a domain wall variant pattern comprises r1/r2/r1/r2.

17. The strained dielectric material of claim 2, wherein at least one of the first or second domain wall variant type comprises a plurality of domain structures comprising c/a/c/a, ca*/aa*/ca*/aa*, ca1/ca2/ca1/ca2, a1/a2/a1/a2, aa1/aa2/aa1/aa2, or r1/r2/r1/r2 or a combination thereof.

18. The strained dielectric material of claim 2, wherein growth of material under coherent or partially relaxed tensile strain facilitates location of an intersection of domain wall variant phases at a predetermined temperature.

19. The strained dielectric material of claim 2, wherein the dielectric material exhibits in-plane or plane-normal dielectric tunability ratio of n=5:1 to n=10:1, and n=10:1 to n=20:1, and n=20:1 to n=50:1 and n=50:1 to n=100:1, and n=100:1 to n=200:1.

20. An article comprising the strained dielectric material of claim 2, the article comprising a radio-frequency tunable filter, a tunable antenna, tunable phase shifter, tunable detector, voltage-tunable oscillator, sensor, actuator or transducer, or impedance matching circuit element.

\* \* \* \* \*